United States Patent
Hoshino

(10) Patent No.: US 8,497,686 B2
(45) Date of Patent: Jul. 30, 2013

(54) APPARATUS AND METHOD FOR MAKING BATTERY VALUE INDEX

(75) Inventor: Masayuki Hoshino, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 478 days.

(21) Appl. No.: 12/871,376

(22) Filed: Aug. 30, 2010

(65) Prior Publication Data

US 2011/0050239 A1 Mar. 3, 2011

(30) Foreign Application Priority Data

Aug. 31, 2009 (JP) ................................. 2009-201070
Sep. 28, 2009 (JP) ................................. 2009-221983

(51) Int. Cl.
*G01N 27/416* (2006.01)
*H02J 7/00* (2006.01)

(52) U.S. Cl.
USPC .......................................... 324/435; 320/132

(58) Field of Classification Search
USPC .......................................... 324/435; 320/132
See application file for complete search history.

(56) References Cited

U.S. PATENT DOCUMENTS

| | | | | |
|---|---|---|---|---|
| 5,250,905 A | * | 10/1993 | Kuo et al. ..................... | 324/435 |
| 6,433,513 B1 | * | 8/2002 | Hayashi ........................ | 320/132 |
| 6,563,318 B2 | * | 5/2003 | Kawakami et al. ........... | 324/426 |
| 6,621,250 B1 | * | 9/2003 | Ohkubo et al. ............... | 320/136 |
| 8,108,160 B2 | * | 1/2012 | Liu et al. ........................ | 702/63 |
| 2005/0001625 A1 | * | 1/2005 | Ashtiani et al. ............... | 324/426 |

OTHER PUBLICATIONS

Hiroshi Kashu, "Consideration of Lease and Secondary Use of Battery", Nikkei Electronics, http://techno.nikkeibp.co.jp/article/NEWS/20090716/173149/, Jul. 16, 2009, 3 pages with English translation.

* cited by examiner

*Primary Examiner* — M'Baye Diao
(74) *Attorney, Agent, or Firm* — Oblon, Spivak, McClelland, Maier & Neustadt, L.L.P.

(57) ABSTRACT

According to one embodiment, a method for making a battery value evaluation index, includes applying a predetermined charge/discharge pattern to a predetermined battery, detecting a largest SOC value and a smallest SOC value of the predetermined battery, and setting a width between the largest SOC value and the smallest SOC value as "A", detecting a charge limit SOC value at which the predetermined battery shows the highest SOC value, detecting a discharge limit SOC value at which the predetermined battery shows the lowest SOC value, and setting a width between the charge limit SOC value and the discharge limit SOC value as "B", and determining that a life of the predetermined battery has ended in the predetermined charge/discharge pattern when a state of B>A has changed into a state of B≧A.

7 Claims, 19 Drawing Sheets

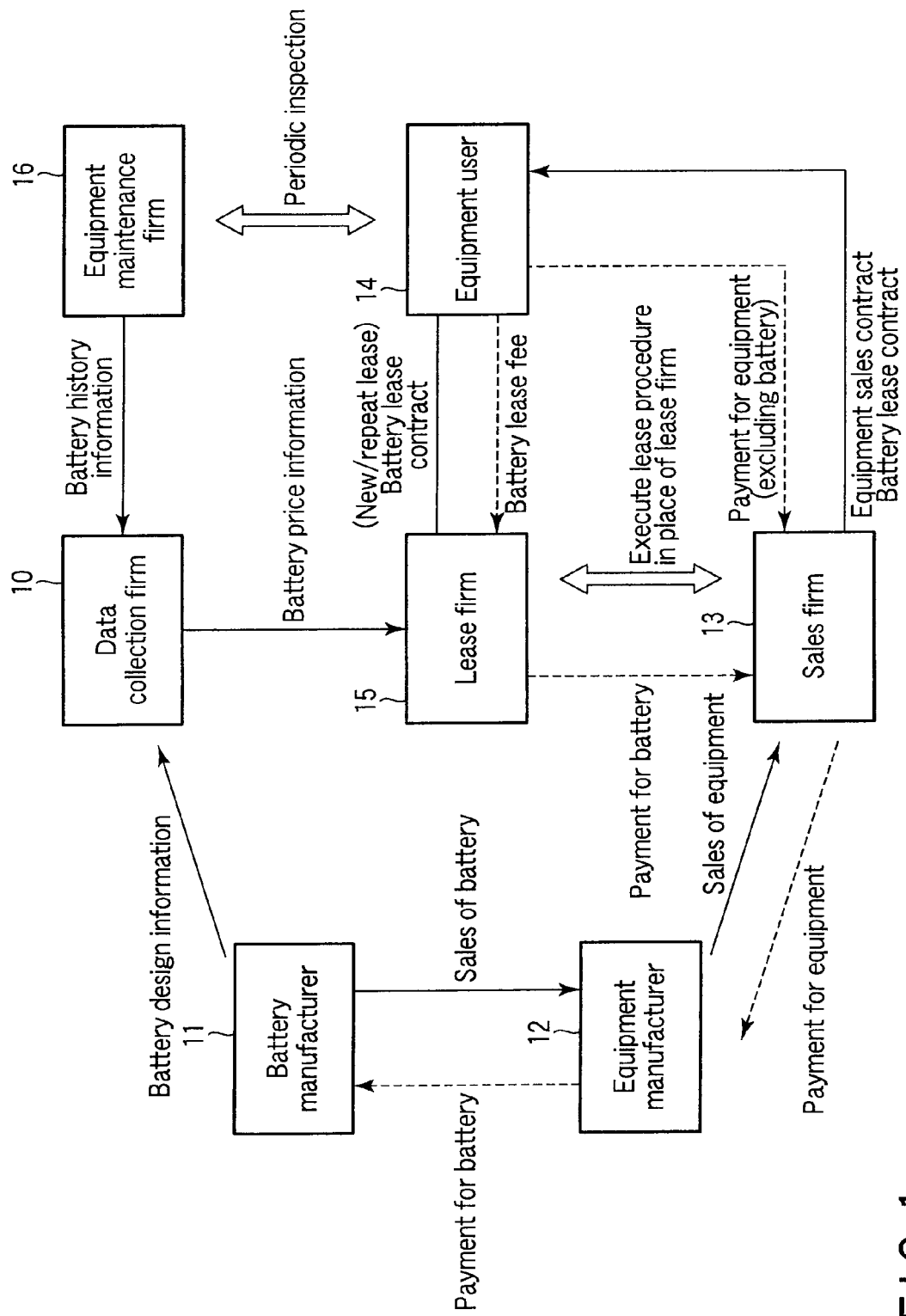
F I G. 1

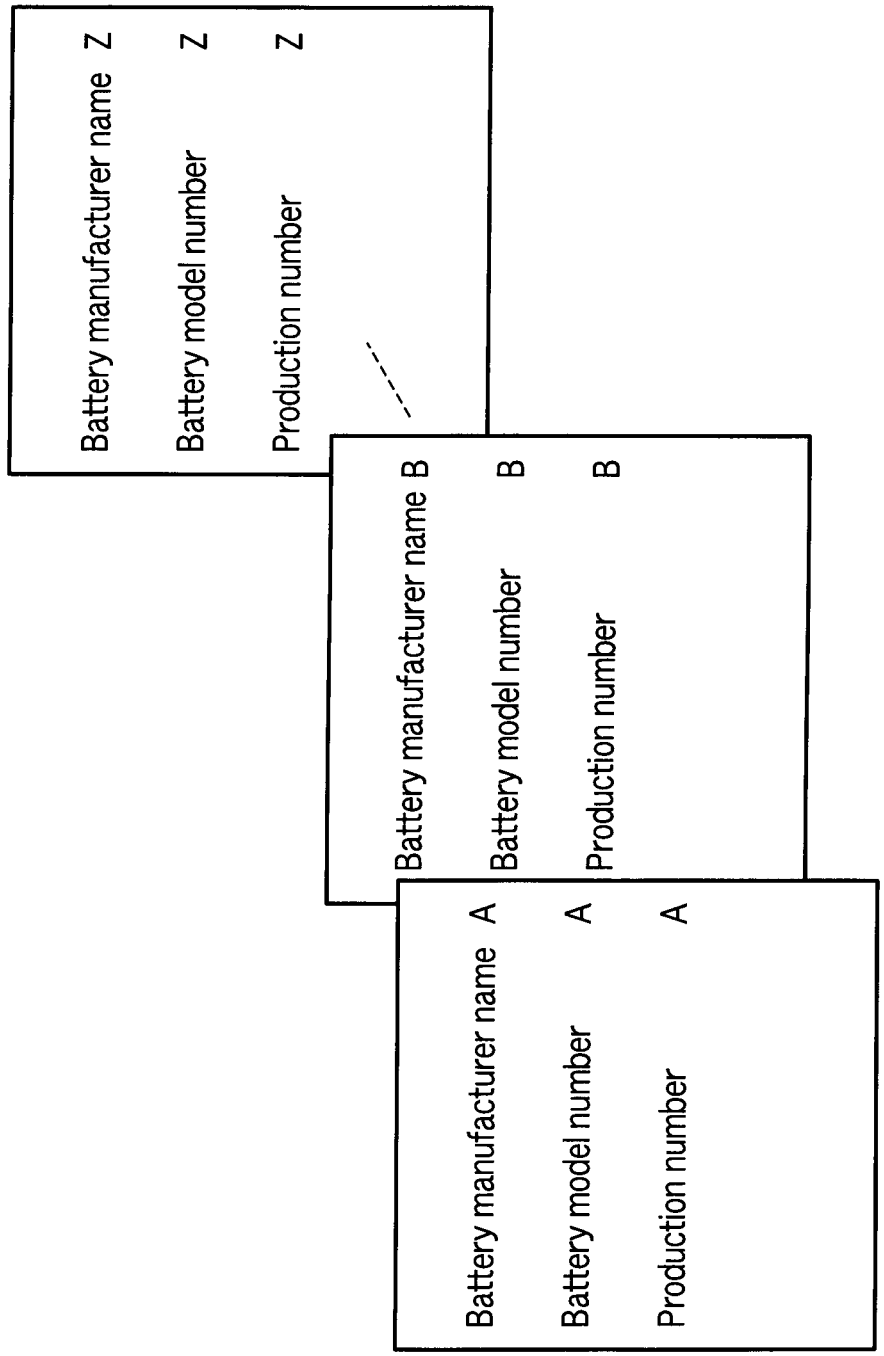
F I G. 4

35a

| Set conditions | Shape | (AA) |
| | Nominal voltage | (24V) |
| | Use voltage width | (±10%) |
| | Temperature range | (-10°C~45°C) |
| | Charge/discharge current | (20A) |
| | Use frequency | (B) |
| Price reference | | |
| Predicted charge-dischargeable range value at start of use | Charge-discharge-able range value at start of use | |
| | Charge-discharge-able range value after one month of use | |
| | ⋮ | |
| | Charge-discharge-able range value after n months of use | |
| Predicted cumulate amount | Cumulate amount at start of use | |
| | Cumulate amount after one month of use | |
| | ⋮ | |
| | Cumulate amount after n months of use | |
| | Battery price when lease period expires | |
| | Residual value when lease period expires | |
| | Correction amount | |
| | Battery price when repeat lease starts | |
| | ⋮ | |

FIG. 5

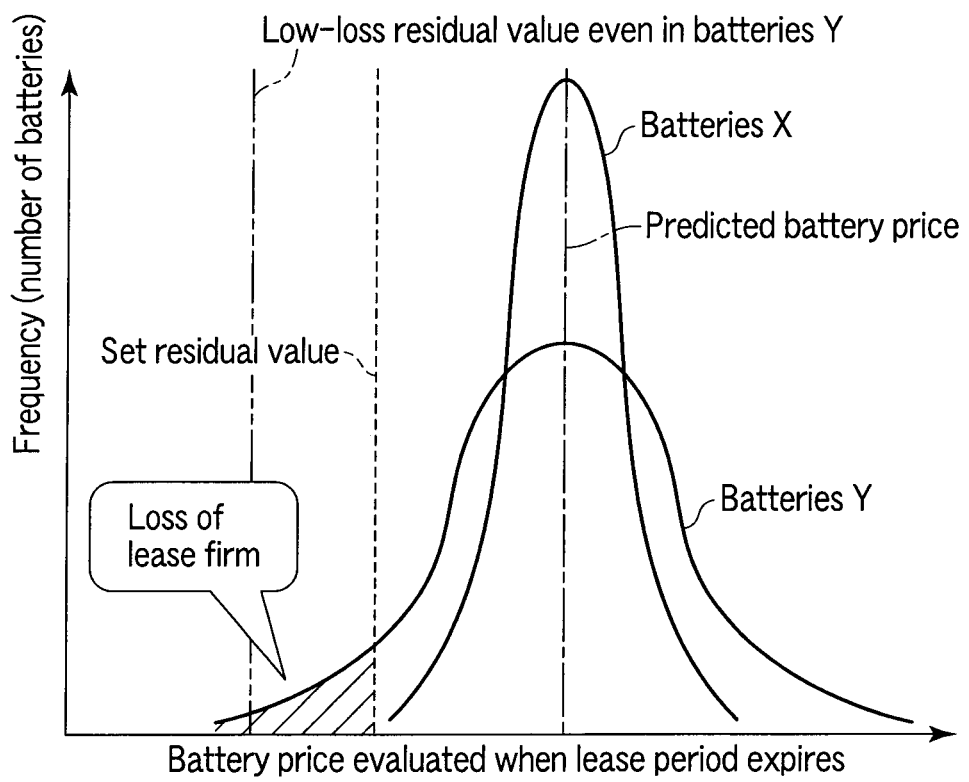
F I G. 17

| Set conditions | | | | | Production number | Lease firm | Production date | Predicted cumulate amount | Battery price | Lease fee | | |
|---|---|---|---|---|---|---|---|---|---|---|---|---|
| Shape | Nominal voltage | aa | bb | cc | | | | | | One year | Two years | Three years |
| | | | | | | | | | | | | |
| AA | BB | a1 | b1 | c1 | | | | | | | | |
| | | | | | Model number | | | | | | | |
| | | | | | CC | | | | | | | |
| | | | | | DDD1 | KK | ... | ... | ... | ... | ... | ... |
| | | | | | DDD2 | JJ | ... | ... | ... | ... | ... | ... |
| | | | | | DDD3 | JJ | ... | ... | ... | ... | ... | NA |
| | | | | | DDD4 | KK | ... | ... | ... | ... | ... | ... |
| | | | | | CD | | | | | | | |
| | | | | | EEE1 | KK | ... | ... | ... | ... | ... | ... |

F I G. 18

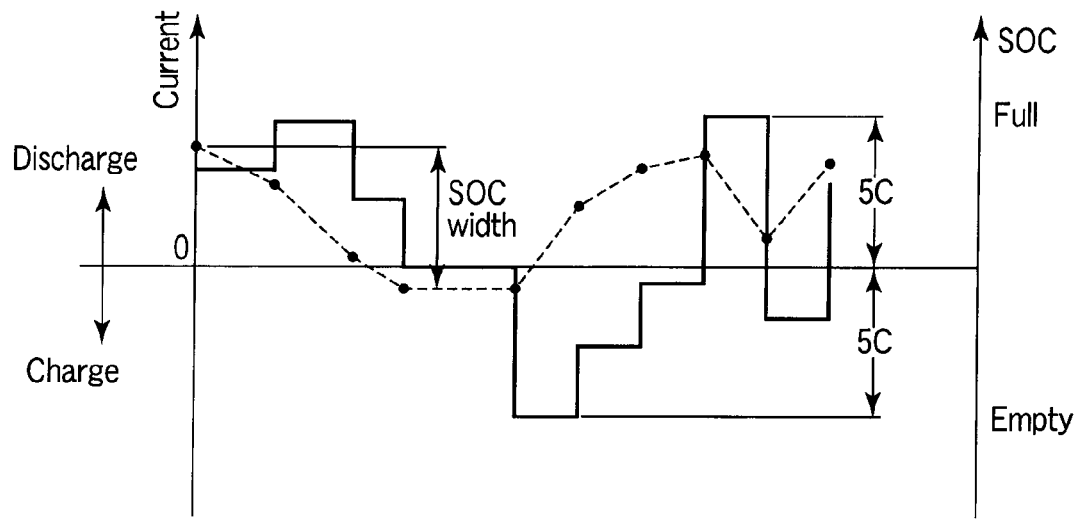
F I G. 19
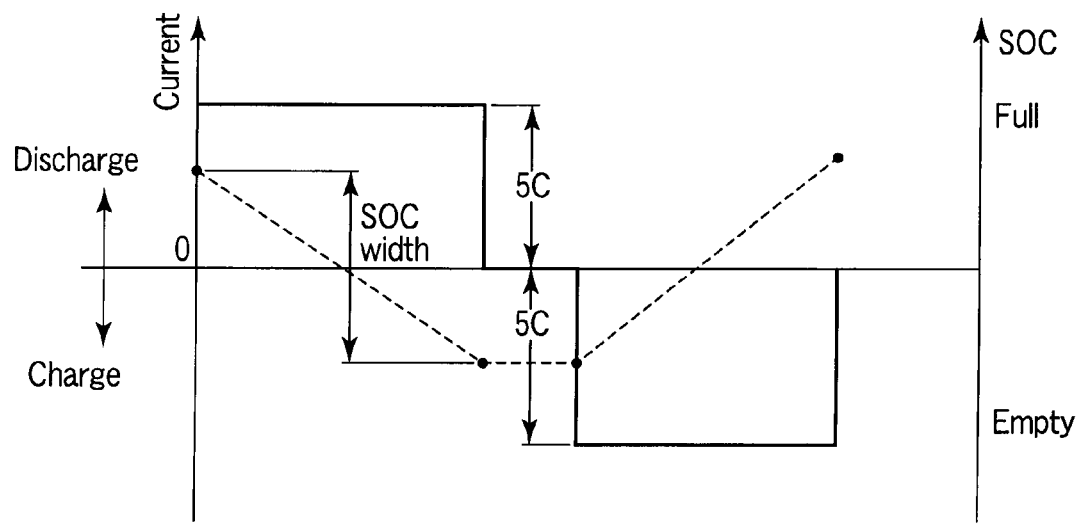
F I G. 20

| Set conditions | | | Price reference | Residual value | | |
|---|---|---|---|---|---|---|
| | | | | Assumed cumulate amount | | |
| aa | bb | cc | | xxx | yyy | zzz |
| a1 | b1 | c1 | xxxxx | ... | ... | ... |
| a2 | b2 | c2 | xyxxx | ... | ... | ... |
| a3 | b3 | c3 | yxxxx | ... | ... | ... |
| a4 | b4 | c5 | zxxxx | ... | ... | ... |
| a3 | b3 | c3 | zyxxx | ... | ... | ... |

FIG. 22

Measured maintained amount

Record measured value

| Set conditions | | | Elapsed period | | | |
|---|---|---|---|---|---|---|
| aa | bb | cc | 0 | 1 | 2 | 3 |
| ... | ... | ... | ... | ... | | |
| ... | ... | ... | ... | ... | | |

FIG. 23

APPARATUS AND METHOD FOR MAKING BATTERY VALUE INDEX

CROSS-REFERENCE TO RELATED APPLICATIONS

This application is based upon and claims the benefit of priority from Japanese Patent Applications No. 2009-201070, filed Aug. 31, 2009; and No. 2009-221983, filed Sep. 28, 2009; the entire contents of both of which are incorporated herein by reference.

FIELD

Embodiments described herein relate generally to an apparatus and a method for making battery value index.

BACKGROUND

Recently, electric vehicles (EVs), which can provide a clean environment by preventing atmospheric pollution caused by exhaust gases, are being vigorously marketed. When it is intended to popularize the electric vehicles, one of the problems is that a battery mounted on the electric vehicle is expensive. For example, it is pointed out that a largest cost factor of the electric vehicle is the battery. Further, a sales system for leasing a battery by separating a battery cost from a vehicle cost has been also proposed.

Incidentally, a lease is roughly classified into a finance lease and an operating lease. A difference between the finance lease and the operating lease lies in whether or not a residual value is set. "Residual value" means a value of an object to be leased at the time a lease period expires.

In the finance lease, an amount obtained by dividing an object price by a lease period becomes the base of a lease fee, whereas in the operating lease, an amount obtained by dividing a difference between an object price and a residual value by a lease period becomes the base of a lease fee.

Accordingly, when a sales system for leasing a rechargeable battery is employed and the operating lease can be applied, a lease fee can be reduced by an amount corresponding to the residual value, and thus it is considered that the sales system will contribute to popularization of the expensive rechargeable battery.

However, heretofore, since the SLI battery (starting, lighting, ignition) equipped with car is treated as consumables because the life of the SLI battery is shorter than that of a vehicle main body, the SLI battery cannot be treated as a subject of the operating lease. Thus, the remaining life and the value calculation of the large rechargeable battery, which must have a long life so that it can be installed in the electric vehicle, are not sufficiently examined.

Accordingly, when it is intended to lease the rechargeable battery, there are needs for an apparatus for making it possible to appropriately evaluate the value of a rechargeable battery in respective situations before, during, and after the lease.

BRIEF DESCRIPTION OF THE DRAWINGS

FIG. 1 is a schematic exemplary view showing a distribution system of a rechargeable battery according to an embodiment;

FIG. 4 is an exemplary view showing a configuration of a battery price database according to the embodiment;

FIG. 5 is an exemplary view showing the contents of the battery price database according to the embodiment;

FIG. 17 is an exemplary view of a graph showing the behaviors of a battery price and a set residual value according to the embodiment;

FIG. 18 is an exemplary view of a table showing the contents of database disclosed by broker firms according to the embodiment;

FIG. 19 is an exemplary view of a graph schematically showing the transition of a charge ratio SOC when a charge and a discharge are executed by a pulse according to the embodiment;

FIG. 20 is an exemplary view of a graph schematically showing the transition of the charge ratio SOC when the charge and the discharge are continuously executed according to the embodiment;

FIG. 22 is an exemplary view showing the contents of a battery price table in the battery price database according to the embodiment; and FIG. 23 is an exemplary view of a table showing an example of a summing method used when it is intended to transmit a measured charge-discharge-able range value according to the embodiment.

DETAILED DESCRIPTION

Figure 2:
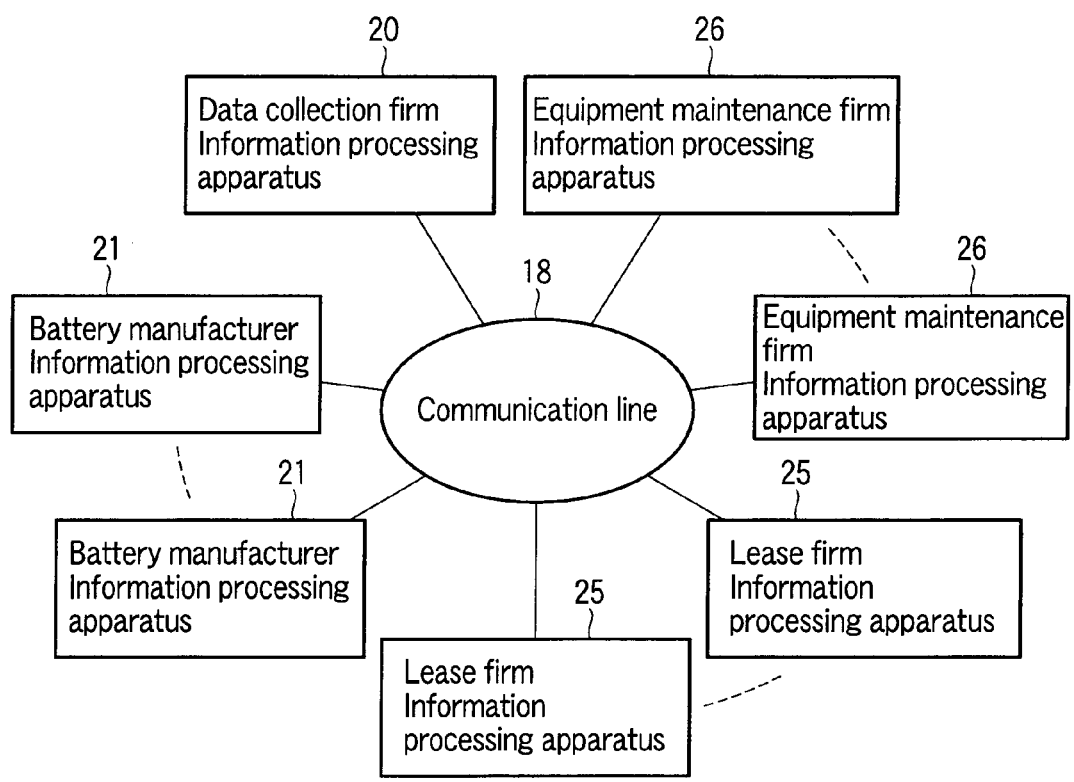
FIG. 2 is an exemplary view showing a configuration of a battery price evaluation support system to which a battery value evaluation support apparatus is assembled according to the embodiment.

In general, according to one embodiment, a method for making a battery value evaluation index, comprising: applying a predetermined charge/discharge pattern to a predetermined battery, detecting a largest SOC value and a smallest SOC value of the predetermined battery, and setting a width between the largest SOC value and the smallest SOC value as "A"; detecting a charge limit SOC value which the battery exhibits when the battery is charged to a charge termination voltage by use of a charge current value at which the predetermined battery shows the highest SOC value, detecting a discharge limit SOC value which the battery exhibits when the battery is discharged to a charge termination voltage by use of a discharge current value at which the predetermined battery shows the lowest SOC value, and setting a width between the charge limit SOC value and the discharge limit SOC value as "B"; and determining that a life of the predetermined battery has ended in the predetermined charge/discharge pattern when a state of B>A has changed into a state of B≦A.

[First Embodiment]

A process for evaluating a battery value will be explained referring to FIG. 1 before a battery value evaluation support apparatus of a first embodiment is explained.

FIG. 1 is a schematic exemplary view showing a distribution system of a rechargeable battery according to the embodiment.

In the evaluation process, a data collection firm 10 manages information for evaluating a value of a battery as a subject of lease in an integrated fashion. The information for evaluating the battery value is composed of information relating to a battery design, history information relating to the characteristics of a used battery, and the like. A value corresponding to a use period of the battery can be obtained from the information for evaluating the battery value.

When a remaining value and a battery price are examined, it is assumed that they have the following relationship:

$$\text{Remaining value}(i) \times \text{market value}(i) = \text{price}(i)$$

The remaining value means a remaining capability which is assumed to be provided with the battery. The remaining value has a direct correlation with values (for example, a charge-discharge-able range value, a cumulate amount, and the like to be described later) which can be objectively obtained.

The residual value and the market value of the battery changes according to by what usage it uses it.

In the expression, the variation is shown as a suffix (i=1 to n). That is, it is considered that the price is determined as a result of a human-induced judgment for selecting any one of plural usages of the battery. the price which is determined, is residual value.

Based on the consideration described above, a price calculated by an apparatus is presented as an index for supporting determination of a residual value executed by a person.

However, the price can be also treated as an actually used price when the values of coefficients relating to a price determination such as a price reference are adjusted well.

Further, in the following description, a price of a battery or a battery price has the same meaning as a battery price when a lease period expires unless otherwise specified.

FIG. 1 shows how a rechargeable battery is distributed.

A battery manufacturer 11 sells a battery to an equipment manufacturer 12 and gets payment for the battery.

The battery manufacturer 11 presents characteristic data and design information uniquely corresponding to a battery to be sold to a data collection firm 10.

The equipment manufacturer 12 manufactures equipment on which the battery is mounted, sells the equipment to a sales firm 13, and gets payment for the equipment.

The sales firm 13 sells the equipment on which the battery is mounted to an equipment user 14. At this time, a buy and sale contract and a battery lease contract are concluded between the sales firm 13 and the equipment user 14.

The sales firm 13 accepts a consignment of business activities between the sales firm 13 and a lease firm 15 to execute a lease procedure in place of the lease firm 15.

The sales firm 13 gets payment for the equipment excluding payment for the battery from the equipment user 14 and gets payment for the battery from the lease firm 15.

When the lease firm 15 concludes the lease contract with the equipment user 14, the lease firm 15 obtains information relating to a price of the battery from the data collection firm 10 and sets a predetermined lease fee and a duty for a periodic inspection consultation.

The equipment user 14 pays the predetermined lease fee to the lease firm 15 by a predetermined payment method.

The equipment user 14 requests a periodic inspection of the equipment to an equipment maintenance firm 16.

The equipment maintenance firm 16 inspects the equipment as well as inspects the battery and presents a result of inspection to the data collection firm 10 as battery history information. The data collection firm 10 uses the history information as information for correcting the remaining value of the battery.

When the lease firm 15 intends to update the lease fee, the lease firm 15 obtains a newest residual value in consideration of the battery history information as to the battery from the data collection firm 10 and calculates a new residual value and a new lease fee.

When the equipment user 14 desires a repeat lease of the battery, the lease firm 15 calculates a repeat lease fee by obtaining a newest remaining value of the battery from the data collection firm 10.

FIG. 2 is an exemplary view showing a configuration of a battery price evaluation support system to which a battery value evaluation support apparatus is assembled according to the embodiment.

The battery price evaluation support system is composed of an information processing apparatus 20 capable of being connected to a communication line 18 and disposed in the data collection firm 10, an information processing apparatus 21 disposed in the battery manufacturer 11, an information processing apparatus 25 disposed in the lease firm 15, and an information processing apparatus 26 disposed in the equipment maintenance firm 16. The information processing apparatus 20 disposed in the data collection firm 10 corresponds to the battery value evaluation support apparatus of the embodiment.

The communication line 18 is a path widely used for transmission/reception of information and is not limited to a wired communication using wires such as a conductive wire or an optical fiber and includes a wireless communication using light, sound, radio wave, and the like.

Note that the information processing apparatuses 21, 25, 26 are communication terminals. The information processing apparatuses 21, 25, 26 need not be connected to the communication line 18 at all times, and transmit and receive information when necessary by being connected to the communication line 18. The information processing apparatus 20 disposed in the data collection firm 10 is connected to the communication line 18 at all times and receives and transmits information.

Figure 3:
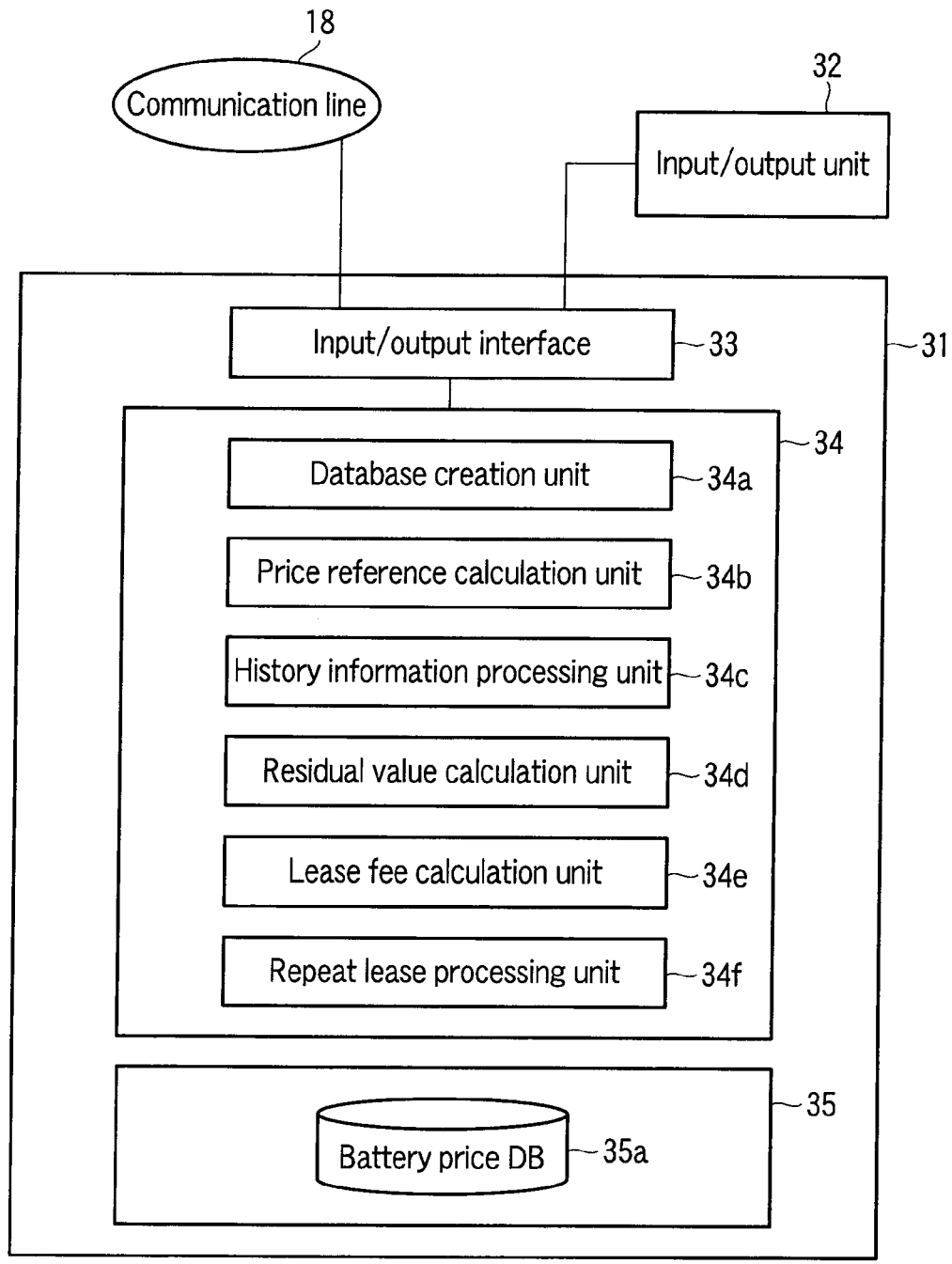
FIG. 3 is an exemplary view of a block diagram showing a configuration of a data collection firm information processing apparatus according to the embodiment.

FIG. 3 is an exemplary view of a block diagram showing a configuration of the data collection firm information processing apparatus according to the embodiment.

The information processing apparatus 20 comprises a processing apparatus main body 31 as a main body for evaluating a battery price and an input/output unit 32 for inputting and outputting information between the processing apparatus main body 31 and an operator.

The processing apparatus main body 31 is provided with an input/output interface 33, a controller 34, and a data unit 35.

The input/output interface 33 is an interface for exchanging various types of information between the respective information processing apparatuses connected to the communication line 18 and the input/output unit 32.

The controller 34 has various functions for evaluating the battery price.

The data unit 35 is provided with a battery price database 35a in which data necessary for driving the respective functions of the controller 34 are stored.

The controller 34 comprises a database creation unit 34a, a price reference calculation unit 34b, a history information processing unit 34c, a remaining value calculation unit 34d, a lease fee calculation unit 34e, and a repeat lease processing unit 34f.

The database creation unit 34a creates a new file in the battery price database 35a based on the battery design information from the battery manufacturer information processing apparatus 21.

The price reference calculation unit 34b calculates "price reference" that expresses a market price as a factor used when the battery price is calculated. However, if the calculation of the battery price is difficult, only a price reference, which is previously input as data, may be captured.

The history information processing unit 34c determines a correction value used when the history information processing unit 34c calculates the battery price based on the battery history information from the equipment maintenance firm information processing apparatus 26.

The residual value calculation unit 34d determines a residual value when a lease period expires. The residual value is used to calculate the lease fee unlike the battery price described above.

The lease fee calculation unit 34e calculates a unique lease fee of a battery as a subject using the residual value determined by the residual value calculation unit 34d.

The repeat lease processing unit 34f arranges data of a relevant file when the battery is leased repeatedly (used again).

Subsequently, a configuration and contents of the battery price database 35a will be explained.

FIG. 4 is an exemplary view showing the configuration of the battery price database according to the embodiment.

The battery price database 35a is classified according to each of battery manufacturer names, battery model numbers, and production numbers. The production number is a unique number attached to each of batteries. Accordingly, when the battery price database 35a is searched using the battery manufacturer name, the battery model number, and the production number as keywords, inherent information of a predetermined battery can be extracted.

FIG. 5 is an exemplary view showing the contents of the battery price database according to the embodiment.

An item "set conditions" prescribe an item used as a reference when a battery is selected in a market and a use condition which affects a battery life. Since it is rational to set the battery price according to a condition under which the battery is used, plural levels are prescribed as "set conditions". Then, respective information shown in FIG. 5 is provided corresponding to plural "set conditions".

"Setting conditions" of the embodiment prescribe "shape", "nominal voltage", "use voltage width", "temperature range", "charge/discharge amount" "charge/discharge pattern", and "use frequency" which are related to each other.

"Shape" shows a necessary installation space which includes, for example, the size (length, width, height) of the battery. "Shape" may be expressed by a standardized size classification (category).

"Nominal voltage" and "use voltage width" are values which can be provided to equipment, to which the battery is connected, as an operation voltage. "Use voltage width" is included in the set conditions as an item for determining whether or not the battery is suitably connected to the equipment.

Figure 6:
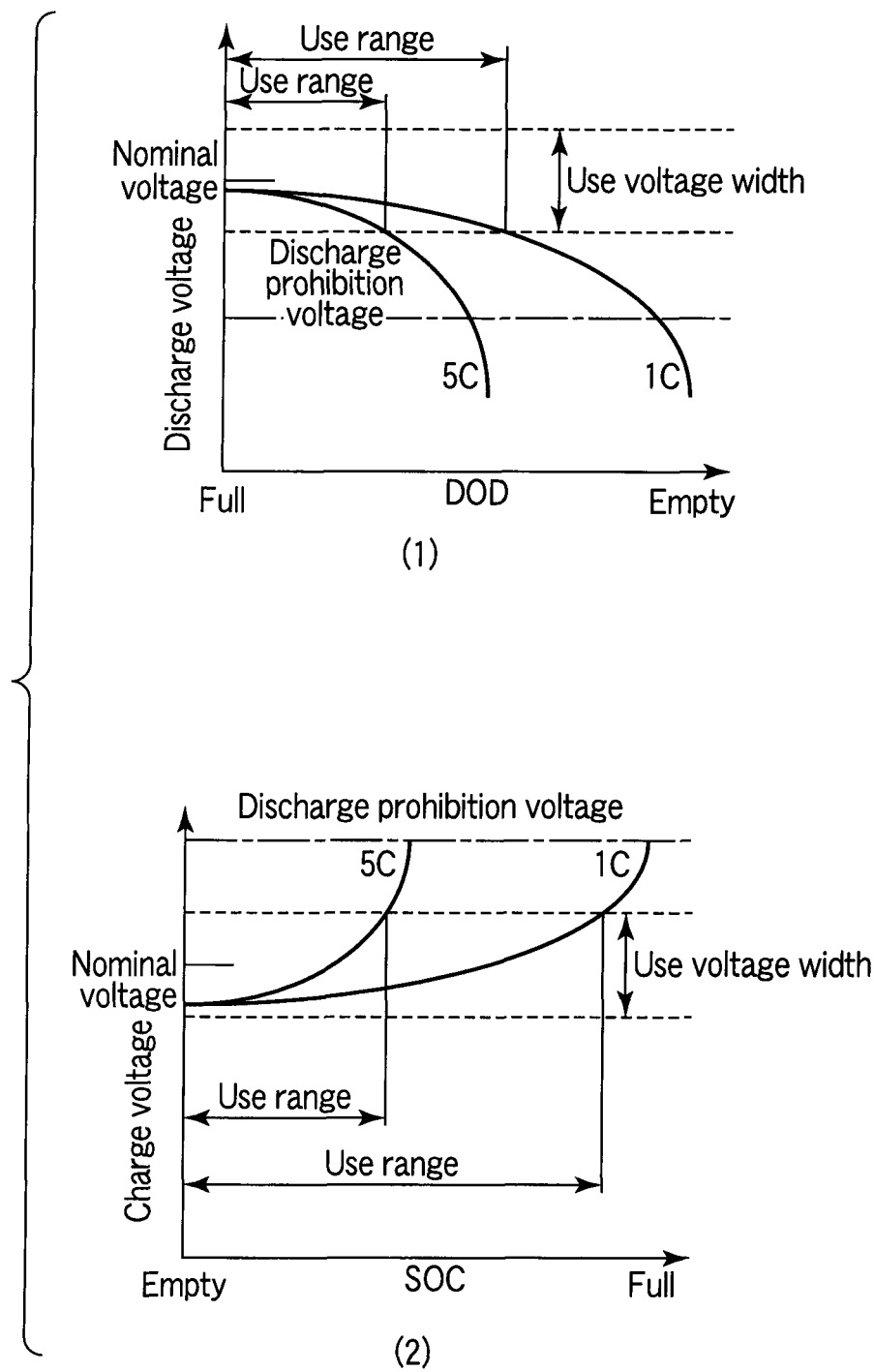
FIG. 6 is exemplary view of graphs explaining a nominal voltage and a use voltage width according to the embodiment.

FIGS. 6(1) and 6(2) are exemplary views of graphs for explaining the nominal voltage and the use voltage width according to the embodiment.

FIG. 6(1) is a graph schematically showing the relationship between a discharge current and a discharge voltage. A vertical axis of a coordinate shows the discharge voltage, and a horizontal axis qualitatively shows a discharge depth (depth of discharge [DOD]). A left end of the horizontal axis shows a full state of the battery, and a right end shows an empty state of the battery. A curved line shown by 1C in FIG. 6(1) shows characteristics when a discharge is executed by a current that discharges a nominal capacity in one hour, and a curved line shown by 5C shows characteristics when a discharge is executed by a current five times the current of 1C.

A use voltage width is set above and below "nominal voltage" of the vertical axis as a center therebetween. Accordingly, the ranges up to the points where the discharge curved lines 5C, 1C, which start from the fill state of the battery, intersect the lower line of the use voltage width, respectively are ranges in which the battery can be discharged by the discharge current.

FIG. 6(2) is a view schematically showing the relationship between a charge current and a charge voltage. A vertical axis of a coordinate shows the charge voltage, and a horizontal axis qualitatively shows a charge ratio (state of charge [SOC]). A left end of the horizontal axis shows the empty state of the battery, and a right end shows the full state. A curved line shown by 1C in FIG. 6(2) shows characteristics when a charge is executed by a current that charges a nominal capacity in one hour, and a curved line shown by 5C shows characteristics when a charge is executed by a current five times the current of 1C.

A use voltage width is set above and below "nominal voltage" of the vertical axis as a center therebetween. Accordingly, the ranges up to the points where the charge curved lines 5C, 1C, which start from the empty state of the battery, intersect the upper line of a use voltage width, respectively are ranges in which the battery can be charged by the charge current.

As described above, since the use voltage width is a factor which greatly affects the performance of the battery, "use voltage width" is set as the set conditions. A technical meaning of "use voltage width" will be explained later.

"Temperature range" shows a temperature condition under which the battery can be used. The item may be prescribed as, for example, $-10°$ C. to $45°$ C. as a minimum value and a maximum value or may be expressed by information for designating a previously segmented temperature range.

When a charge and a discharge are executed continuously, "charge/discharge amount" is shown by a current value, and when the charge and the discharge are executed by a pulse, "charge/discharge amount" is shown by a maximum current in a pulse pattern.

When the charge and the discharge are executed continuously, "charge/discharge pattern" relates to the continuation time of the charge and the discharge, and when the charge and the discharge are executed by the pulse, "charge/discharge pattern" relates to a pulse pattern. Various continuation times and pulse patterns are set, inherent identification codes are related to them, and the identification codes are recorded as "charge/discharge pattern numbers".

FIG. 19 is an exemplary view of a graph schematically showing the transition of the charge ratio SOC when the charge and the discharge are executed by the pulse according to the embodiment. The charge and the discharge by the pulse will be explained referring to FIG. 19.

A vertical axis on a left side of FIG. 19 shows a current, and an upper side shows a discharge and a lower side shows a charge using a position 0 as a reference. A horizontal axis is a time axis, and a time elapses from left to right. A step-like waveform shown in FIG. 19 by a solid line is a pulse pattern of the charge and the discharge. A vertical axis on a right side of FIG. 19 shows the charge ratio SOC, and an upper side shows a full state of a battery and a lower side shows an empty state of the battery. A broken line shown by a dotted line in FIG. 19 shows the transition of the charge ratio SOC which changes according to the pulse pattern.

The charge ratio SOC is determined as an integral amount of the pulse pattern. The transition of the charge ratio SOC will be explained. When a current shown by a first pulse starts to be discharged from a position on a left end in the time axis, an SOC curved line changes from the full state to the empty state and has right down characteristics. As shown by a second pulse, when the discharge current is more increased, the SOC curved line is more inclined right down. When the discharge current is reduced as shown by a third pulse, the SOC curved line is gently inclined right down. When the current stops, the SOC curved line keeps its state. When a current starts to be charged, the SOC curved line is inclined right up contrary to the operation described above.

As described above, the SOC curved line also exhibits a pattern repeated in a certain width corresponding to a repetition of the pulse pattern of the charge and the discharge. FIG. 19 shows the case in which the charge current and the discharge current which are the widths of the pulse pattern are 5C, respectively, and the difference between the maximum value and the minimum value of the SOC curved line is called "SOC width".

The idea is not limited to the charge and the discharge executed by the pulse and can be expanded and applied also to the case in which the charge and the discharge are executed continuously.

FIG. 20 is an exemplary view of a graph schematically showing the transition of the charge ratio SOC when the charge and the discharge are continuously executed according to the embodiment. Since explanation of a coordinate and a curve line is the same as FIG. 19, detailed explanation thereof is omitted. As shown in FIG. 20, when a charge current and a discharge current can be regarded constant, it can be considered that the continuous charge and discharge are the same as the charge and the discharge executed by the pulse pattern. In other words, when a charge/discharge pattern inherent to a motif is provided as a model and attention is paid to "SOC width" obtained from the model, it is shown that the continuous charge/discharge and the charge/discharge executed by the pulse pattern can be treated by a uniform index.

The "SOC width," namely, the peak-to-valley of an SOC curve appearing when a predetermined charge/discharge pattern is applied to a predetermined battery is an index indicating the minimum capability of a battery that can be used properly in the motif. This value is set as a "required charge-discharge-able range value (RCRV)."

The "required charge-discharge-able range value (RCRV)" can be defined by the SOC width [%]. Since the battery and the charge/discharge pattern are specified, the SOC width can be converted to energy [Wh] and current amount [Ah]. The "required charge-discharge-able range value (RCRV)" can also be defined by the converted values of [Wh] and [Ah].

An item "use frequency" of the battery price database 35a shown in FIG. 5 is a charge/discharge repetition frequency. When, for example, a pulse pattern width is designated by a charge/discharge amount, a specific numeral may be prescribed as a repetition number of the pulse pattern repeated a day or may be prescribed by information that designates a previously segmented range.

An item "price reference" of the battery price database 35a shown in FIG. 5 is an item used as a factor when the battery price is calculated. The battery price changes depending on difficulty to satisfy "set conditions" described above, the number of equipment used under "set conditions" (demand), the number of batteries capable of being used under "set conditions" (supply), and the like. Thus, a price reference is provided to each of "set conditions". Note that since "price reference" is a value that changes in response to needs, a value obtained referring to other database or a value appropriately set by the lease firm 15 is used.

Items "predicted charge-discharge-able range value" and "predicted cumulate amount" of the battery price database 35a shown in FIG. 5 are information relating to the battery life. Note that a reason why the term "predicted" is used as in the predicted charge-discharge-able range value and the predicted cumulate amount is to show that the data is the design data presented from the battery manufacturer 11 and only predicted values in an assumed standard use state.

"Charge-discharge-able range value after n months" and "cumulate amount after n months" show a standard charge-discharge-able range value and a standard cumulate amount after n months.

A "charge-discharge-able range value (CRV)" indicates an amount enabling the battery to maintain continuous charge/discharge. The "charge-discharge-able range value (CRV)" decreases in accordance with the continuous use of the battery. A decrease in the "charge-discharge-able range value (CRV)" is considered to be a "degradation" of the battery. If the "charge-discharge-able range value (CRV)" is degraded to an amount less than or equal to a required charge-discharge-able range value (RCRV) that is assumed by a predetermined repetition pattern, this means that the battery cannot be stably used in the use method. Accordingly, the time when the "charge-discharge-able range value (CRV)" reduces to the "required charge-discharge-able range value (RCRV)" is the end of the battery life in the motif. If the use time of the battery increases, the battery will degrade, and the charge-discharge-able range value (CRV) will reduce and reach a required charge-discharge-able range value (RCRV) at the end of the battery life in a predetermined motif. When the charge-discharge-able range value (CRV) reaches the required charge-discharge-able range value (RCRV), the value of the battery is lost as a secondary battery in the motif.

A simple method for measuring the charge-discharge-able range value (CRV) of a battery is as follows:

First, the characteristics in the current state of the battery are measured. Then, the maximal current enabling charge/discharge based on the SOC is plotted, thereby obtaining SOC-vs-current curves (a curve corresponding to the time of charging and a curve corresponding to the time of discharging).

Next, of the current values within the range of the charge/discharge pattern used to obtain a required charge-discharge-able range value (RCRV), current value A immediately before the maximum value of the SOC and current B immediately before the minimum value of the SOC are specified.

Then, the SOC value when the battery is charged with current value A and the SOC value when the battery is discharged with current value B are acquired by use of the SOC-vs-current curves.

The width between the two SOC values is acquired. This width corresponds to the maintenance value of the battery.

As described above, the maintenance value and the discharge maintenance value can be converted to "Ah" and "Wh" when the need arises. It is preferable to use "Ah" and "Wh" because a relative value of different batteries can easily be understood.

As the charge final voltage and the discharge final voltage, a value designated by a battery maker is used as a battery use condition to prevent a battery from being overcharged or overdischarged. In other words, the value is constant from the beginning of use to the end of life.

There may be a case where simple measurement method described above cannot obtain an accurate required charge-discharge-able range value (RCRV). In this case, the following measurement method is used.

First, the characteristics in the current state of the battery are measured. Then, the maximal current enabling charge/discharge based on the SOC is plotted, thereby obtaining SOC-vs-current curves (a curve corresponding to the time of charging and a curve corresponding to the time of discharging).

Next, a charge/discharge pattern used for obtaining a required charge-discharge-able range value (RCRV) is imposed on the SOC-vs-current curves.

Then, the imposed charge/discharge pattern is slid in the SOC axis direction on the coordinate axes of the SOC-vs-current curve. When the slid charge/discharge pattern contacts the curve corresponding to the time of charging and the curve corresponding to the time of discharging, the maximum value of the SOC and the minimum value of the SOC are acquired as values corresponding to the charge/discharge pattern.

The width between the minimum value and the maximum value is acquired. This width corresponds to the charge-discharge-able range value (CRV) of the battery. The charge-discharge-able range value (CRV) is understood as a sum of a required charge-discharge-able range value which depends on a battery and a charge/discharge pattern applied to the battery and a capacity of the battery with respect to the required charge-discharge-able range value. If the capacity is large but the charge-discharge-able range value becomes small due to a degradation, the value of the capacity is low. It is therefore inappropriate to use the capacity as a reference for calculating a value of the battery. If the life is short but the charge-discharge-able range value required for a time period during which the life ends is very wide, a technical and economical burden of such a battery is large. It is therefore inappropriate to calculate the value of the battery only based on a period to the end of the life.

A period during which the charge-discharge-able range value reaches a required charge-discharge-able range value, or a period during which the life of the battery ends and a value obtained by accumulating required charge-discharge-able range values, or an integrated value of required charge-discharge-able range values in a period from the current time to the end of the life, are considered to be an index of the value of a rechargeable battery in a predetermined motif. This is represented by item "cumulate amount."

The "cumulate amount" correlates directly with a value of the battery in the motif. The accumulation is performed during which period the charge/discharge pattern is constant. If the charge/discharge pattern varies, the progress of a deterioration varies and thus the deterioration becomes difficult to predict by simulation. When the charge/discharge pattern varies, a charge-discharge-able range value is predicted based on the initial charge/discharge pattern, and the next operation is carried out using a result of the prediction as the initial condition. To obtain a cumulate amount, each of the variables can be multiplied by a coefficient.

Figure 7:
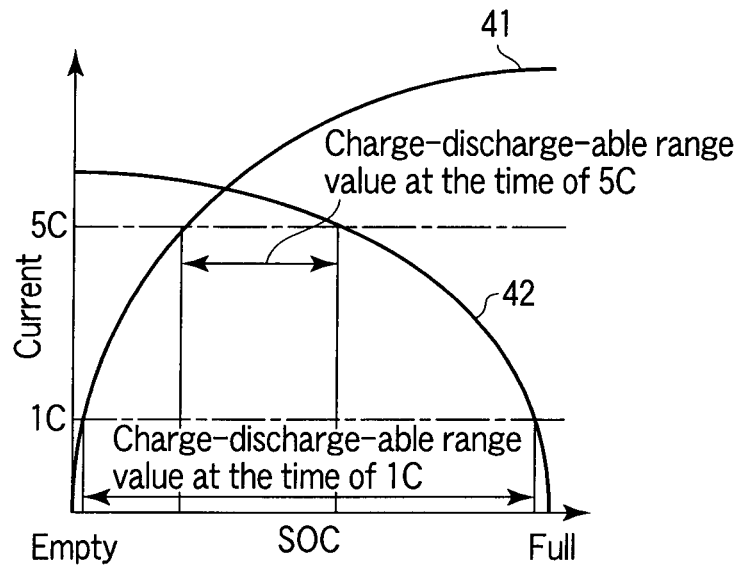
FIG. 7 is a schematic exemplary view of a graph showing the relationship between a charge/discharge current and a charge-discharge-able range value according to the embodiment.

FIG. 7 is a schematic exemplary view of a graph showing the relationship between the charge/discharge current and the charge-discharge-able range value according to the embodiment.

A vertical axis of a coordinate shown in FIG. 7 shows the charge/discharge current, 1C shows a current when the nominal capacity is charged or discharged in one hour (that is, a current of a value obtained by dividing the nominal capacity by one hour), and 5C shows a current five times that of 1C. A horizontal axis qualitatively shows the charge ratio (state of charge [SOC]). A left end of the horizontal axis shows an empty state of a battery, and a right end shows a full state of the battery.

A curve 41, which monotonously goes down from the full state of the battery on the right side in FIG. 7 to the empty state of the battery on the left side, shows a discharging state. A curve 42, which monotonously goes down from the empty state of the battery on the left side to the full state of the battery on the right side, shows a charging state.

In the region surrounded by the two curves, an amount (charge-discharge-able range value) which can be continuously output as the battery, appears. In FIG. 7, double-headed arrows show the charge-discharge-able range values when the charge/discharge currents are fixed at 5C and 1C. It can be found from FIG. 7 that since the double-headed arrow indicating that the charge/discharge current is small is longer in the horizontal direction, a large charge-discharge-able range value can be obtained.

It can be seen from FIG. 7 that an available SOC width varies with the current value and a possible current value varies with the SOC. A necessary SOC width cannot be secured in a predetermined charge/discharge pattern because the "charge-discharge-able range value" is reduced by aged degradation of the battery. The battery can be used continuously though its capacity becomes small; however, when the "charge-discharge-able range value" of the battery is degraded to less than or equal to the "required charge-discharge-able range value" to be described below in the predetermined motif, the battery cannot be used in the motif.

The SOC width explained in FIGS. 19 and 20 appears inside the hyperbolas shown in FIG. 7. Further, a difference in the charge/discharge pattern appears in a difference in the SOC width. Considering a relationship between the SOC and the current value shown in FIG. 19, the charge current value is decreased in an area with a relatively large SOC, and the discharge current value is decreased in an area with a relatively small SOC. Considering a relationship between the SOC and the current value shown in FIG. 20, both the charge current value and the discharge current value are 5C irrespective of the SOC. The pulse pattern as shown in FIG. 19 can be designed to change the SOC width more greatly than the pulse pattern as shown in FIG. 20.

Figure 8:
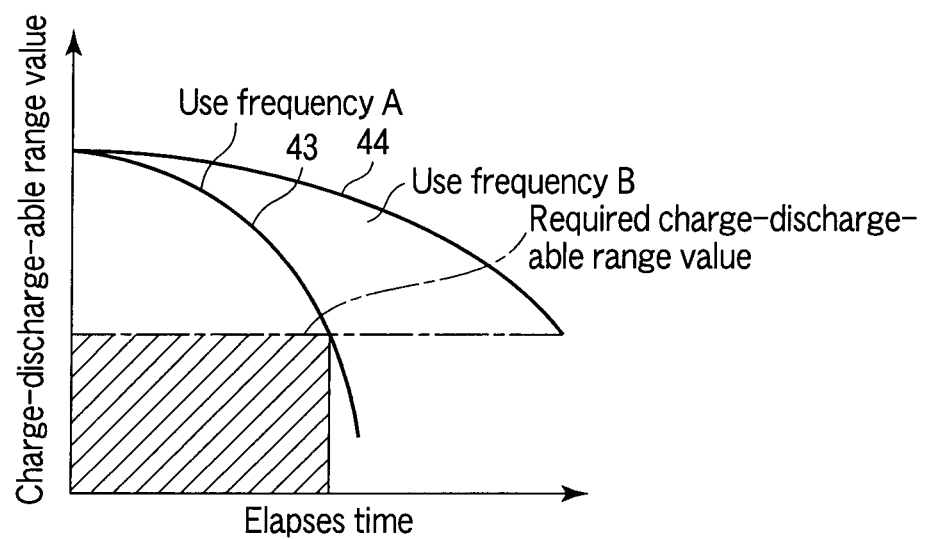
FIG. 8 is an exemplary view of a graph for explaining a cumulate amount according to the embodiment.

FIG. 8 is an exemplary view for explaining the cumulate amount according to the embodiment.

A vertical axis of a coordinate shown in FIG. 8 shows the charge-discharge-able range value (CRV), and a horizontal axis shows a cumulate use time of the battery. The repetition time in a charging/discharging pattern increases from left to right of the horizontal axis. Right down curved lines 43 and 44 in FIG. 8 show how the charge-discharge-able range value (CRV) changes with the increase of the repetition time. Since the battery degrades with the lapse of time, the charge-discharge-able range value (CRV) decreases, accordingly. The time when the charge-discharge-able range value (CRV) reduces to the required charge-discharge-able range value (RCRV) is assumed to the end of the battery life. The "cumulate amount" is represented by the following expression:

Cumulate amount=(required charge-discharge-able range value (RCRV))×(number of times the battery is used till the end of life)

As can be understood from the above, the value in the charge/discharge pattern that needs the required charge-discharge-able range value (RCRV) is determined based on how many times the required charge-discharge-able range value (RCRV) can be repeated until the end of the battery life.

In FIG. 8, curved line 43, which slopes down in a comparatively sharp way, represents how the charge-discharge-able range value (CRV) changes in the case where the use frequency is high, and curved line 44, which slopes down in a comparatively gentle way, represents how the charge-discharge-able range value (CRV) changes in the case where the use frequency is low.

When the battery is used frequently, it degrades. Accordingly, the charge-discharge-able range value (CRV) reduces, and the time when the charge-discharge-able range value (CRV) reduces to the required charge-discharge-able range value (RCRV) is assumed to the end of the battery life.

The comparison between the two curved lines shows that the battery life is long where the number of times the battery is used per unit time is small. In the present embodiment, this battery life is quantitatively evaluated, and the "cumulate amount" is defined by the following formula:

"cumulate amount"=required charge-discharge-able range value (RCRV)×use frequency (number of times/day)×period until life end (days)

The period need not be expressed in terms of days. It may be expressed in terms of months or hours in accordance with the period of the charge/discharge pattern.

In FIG. 8, a shaded portion corresponds to the cumulate amount described above. If the "cumulate amount" has a curved line of the charge-discharge-able range value (CRV) based on the use frequency in a predetermined motif, the life indicated by the curved line can be found from the time (which may be different from an actual use period) corresponding to the charge-discharge-able range value (CRV) measured at an evaluation time to the times of the end of life shown by the curved lines is determined as a cumulate amount at that time. As described above, "cumulate amount" is a value corresponding to the remaining life of the battery in the predetermined motif.

Note that when a charge/discharge pattern, in which a method of using the battery in the predetermined motif is assumed, is set as one cycle, "use frequency" can be also expressed by how many times the charge/discharge pattern is repeated. Types of the charge/discharge pattern are shown in FIGS. 19 and 20.

An item "battery price" of the battery price database 35a shown in FIG. 5 shows the price of the battery in a next market at the time a lease period expires. A method of calculating "the battery price" will be described later.

An item "residual value" of the battery price database 35a shown in FIG. 5 is a value used when the lease fee is calculated, that is, the value is the planned amount of a price at which the battery is returned after the lease period expires.

An item "correction amount" of the battery price database 35a shown in FIG. 5 is a correction coefficient used when the residual value is calculated from the battery price. The "correction amount" is a value calculated using a statistic processing using "history charge-discharge-able range value" measured by the equipment maintenance firm 16. The "history charge-discharge-able range value" is recorded also in the battery price database 35a. Calculation of the correction amount will be described later.

An item "battery price at the time repeat lease starts" of the battery price database 35a shown in FIG. 5 is data used when a repeat lease fee is calculated.

Next, a meaning for prescribing "use voltage width" to the item "set conditions" of the battery price database 35a shown in FIG. 5, will be explained referring to FIG. 9.

Figure 9:
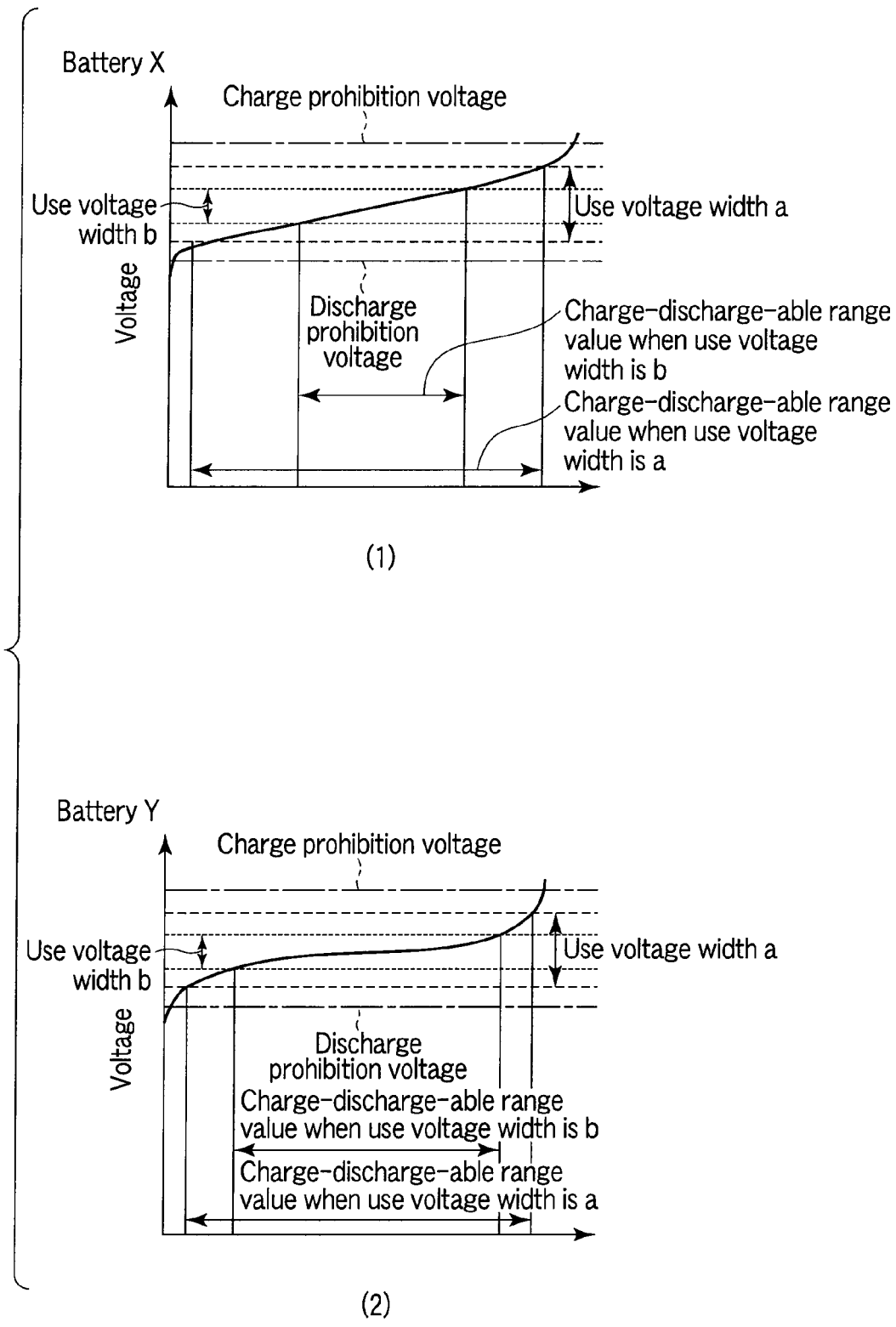
FIG. 9 is exemplary view schematically showing the relationship between a charge/discharge voltage and a charge-discharge-able range value according to the embodiment.

FIGS. 9(1) and 9(2) are exemplary views schematically showing the relationship between the charge/discharge voltage and the charge-discharge-able range value according to the embodiment. FIG. 9(1) shows the characteristics of battery A, and FIG. 9(2) shows the characteristics of battery Y. Battery X and battery Y have the same nominal voltage, charge prohibition voltage, and discharge prohibition voltage.

The following points can be found by comparing FIG. 9(1) with FIG. 9(2). Battery X and battery Y have the same charge-discharge-able range value when the use voltage width is a. When the use voltage width is b, the charge-discharge-able range value of battery X is smaller than the charge-discharge-able range value of battery Y.

Accordingly, when "use voltage width" is prescribed to "set conditions", battery X and battery Y must be evaluated as the same price in a use having the use voltage width a and must be evaluated as battery X<battery Y in a use having the use voltage width b.

As described above, since use voltage width is related to the article characteristics of the battery and correlated with the required charge-discharge-able range value, it is preferable to prescribe "use voltage width" to "set conditions".

Figure 10:
FIG. 10 is an exemplary view of a table showing specific data set to the battery price database according to the embodiment.

Subsequently, an example for calculating the battery price will be explained. FIG. 10 is an exemplary view of a table showing specific data set to the battery price database according to the embodiment.

As described above, since the battery has a different price depending on a reuse condition of the battery at the time the lease period expires even if the battery has the same characteristics, plural prices exist for the same battery. FIG. 10 prescribes four set conditions.

"Price reference" is an item which acts as a factor used when the battery price is calculated at the time the lease period expires, and the lease firm sets the price reference in response to a market price determined by a market and a supply/demand state. Since the capacity of a battery contributes to its available period and cumulate amount, the "price reference" is easy to use for reference if an amount per battery capacity (yen/Ah) is set.

In FIG. 10, since the market price of a battery of the specification of a set condition No. 1 is less than the market price of a battery of the specification of a set condition No. 3, the price reference of the set condition No. 1 is set to a low value of 20, and the price reference of the set condition No. 3 is set to a high value of 100.

Further, the "required charge-discharge-able range value" is a value of the battery when the battery is used under respective set conditions. Since the charge/discharge amount of the set condition No. 1 is lower than the charge/discharge amount of the set condition No. 3, a degree of degradation is low. Therefore, when the lease period expires, the charge-discharge-able range value of the set condition No. 1 is set to a high value of 90% and the charge-discharge-able range value of the set condition No. 3 is set to a low value of 30%.

When the battery is used under the respective set conditions, "cumulate amount" is a value corresponding to an integrated value obtained by integrating a period of the remaining life and a required charge-discharge-able range value. Under the same use conditions, the larger the "cumulate amount," the longer the battery can be used.

In the set condition No. 1, since the charge-discharge-able range value of the initial set value is set to a large value of 90% and the charge/discharge amount is set to a small value of 20 A, the cumulate amount at the time the lease period expires is set to a large value of 1000. On the contrary, in the set condition No. 3, since the charge-discharge-able range value of the initial set value is set to a small value of 30% and the charge/discharge amount is set to a large value of 100 A, the cumulate amount at the time the lease period expires is set to a small value of 180.

Accordingly, it is considered rational to calculate "battery price" using "price reference" and "cumulate amount".

In an example shown in FIG. 10, "battery price" is calculated by determining a product of "price reference" and "cumulate amount". Note that the calculation of "battery price" is not limited to a method of determining a product, and "battery price" may be calculated using a function that employs "price reference" and "cumulate amount" as parameters.

Next, an operation of the battery price evaluation support system will be explained.

Figure 11:
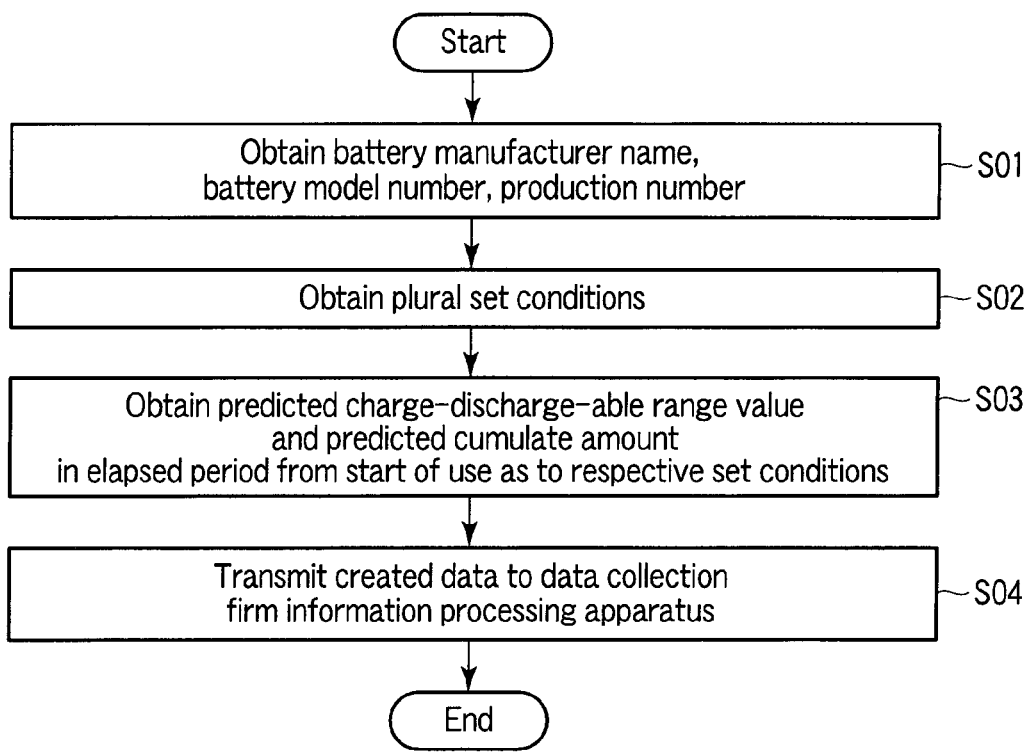
FIG. 11 is an exemplary view of a flowchart showing a schematic procedure of a battery design information transmission processing in a battery manufacturer information processing apparatus according to the embodiment.

FIG. 11 is an exemplary view of a flowchart showing a schematic procedure of a battery design information transmission processing in the battery manufacturer information processing apparatus according to the embodiment.

When a battery is shipped, the battery manufacturer 11 collects characteristic data and design information of the battery. In the collection, for example, required data may be extracted from the database as to a battery owned by the manufacturer 11 and edited for use.

Figure 21:
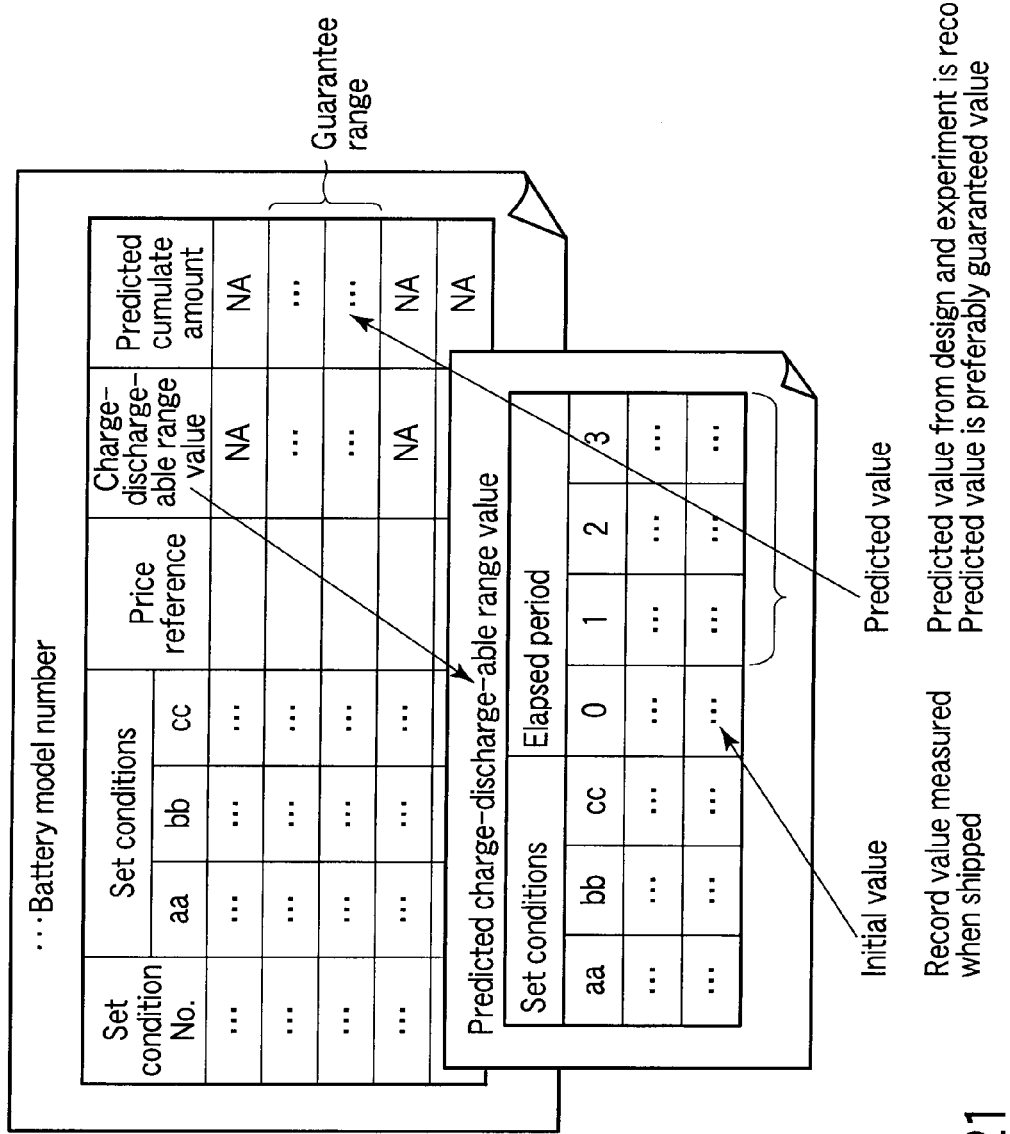
FIG. 21 is an exemplary view showing database relating to batteries owned by the battery manufacturer according to the embodiment.

FIG. 21 is an exemplary view showing the database as to a battery owned by the battery manufacturer according to the embodiment. The database includes a set condition number, set conditions, a price references, a charge-discharge-able range value and a predicted integration amount corresponding to the model number of a battery In step S01 of FIG. 11, the information processing apparatus 21 obtains the battery production number, the battery model number, and the battery manufacturer name of a battery to be shipped.

In step S02, plural levels of set conditions (shape, nominal voltage, use voltage width, temperature range, charge/discharge amount, use frequency) are obtained by receiving a designation of plural set condition numbers of the database as to the battery of the model number.

In step S03, the information processing apparatus 21 obtains the charge-discharge-able range value and the cumulate amount during each passed period as to the respective set conditions. The charge-discharge-able range value and the cumulate amount are predicted values. The values previously set to the database may be used as the predicted charge-discharge-able range value and the predicted cumulate amount, or the predicted charge-discharge-able range value and the predicted cumulate amount may be calculated based on the characteristic data which is theoretical and experimentally determined by measuring the charge-discharge-able range value of a present battery, using the measured value as an initial set value, and using the initial set value as a basis of the calculation.

In step S04, the created data is transmitted to the data collection firm information processing apparatus 20.

In the data collection firm information processing apparatus 20, the database creation unit 34a starts and records the transmitted data to the battery price database 35a. With the operation, a unique data file is newly created in each battery supplied to the market.

Figure 12:
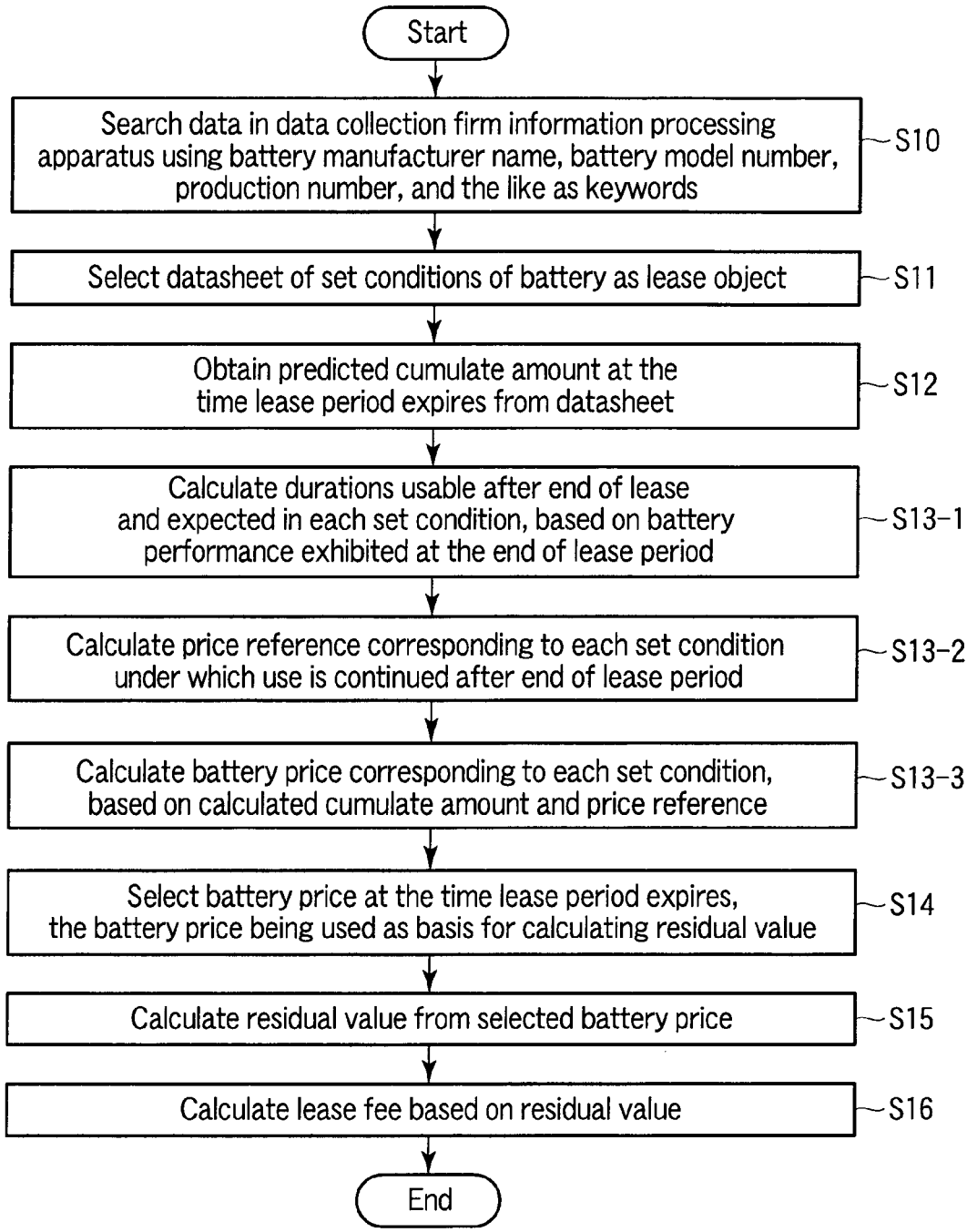
FIG. 12 is an exemplary view of a flowchart showing a schematic processing procedure when a new lease contract is concluded in a lease firm information processing apparatus according to the embodiment.

FIG. 12 is an exemplary view of a flowchart showing a schematic processing procedure when a new lease contract is concluded in the lease firm information processing apparatus according to the embodiment.

When the sales firm 13 newly sells equipment, the sales firm 13 notifies the lease firm 15 of the battery manufacturer name, battery model number, battery production number, and set conditions of a battery to be leased. The lease firm 15 calculates a lease fee based on the information and concludes a lease contract with an equipment user.

In step S10, the information processing apparatus 25 searches the battery price database 35a of the data collection firm information processing apparatus 20 based on the keywords (battery manufacturer name, battery model number, and production number).

In step S11, the information processing apparatus 25 specifies set conditions for the lease object.

In step S12, the predicted cumulate amount at the time the lease period expires is obtained. The predicted cumulate amount at the time the lease period expires is calculated by acquiring a pre-measured achieved value from the table under a predetermined usage environment.

There is a case where the achieved values of charge-discharge-able range values are accumulated if a battery is put into circulation. The predicted cumulate amount can be calculated using both a historical charge-discharge-able range value and a predicted charge-discharge-able range value of a battery company. For example, the difference between the predicted charge-discharge-able range value of the manufacturer and the history charge-discharge-able range value of the battery is determined, and a difference predicted at the time the lease period expires is determined by the process, change, and tendency of the difference using an extrapolation method or the like. The predicted cumulate amount of the battery manufacturer at the time the lease period expires is corrected and used using the determined prediction difference.

When the battery has the measured history as described above, since a state in which the battery is more outstandingly degraded than assumed during a lease contract period can be found by determining the predicted cumulate amount of each battery again according to a present state, a determination whether or not a countermeasure is to be taken to set a lease fee to a higher fee again at the time the battery is exhausted more outstandingly than assumed and an explanation to a customer can be executed easily.

In steps S13-1, S13-2 and S13-3, the battery price corresponding to the respective set conditions at the time the lease period expires is calculated.

First, all of setting conditions the use of which can be assumed are retrieved from the battery performance remaining at the time the lease period expires and when the battery is reused under the setting conditions, a cumulate amount which can be expected in the use from the start of the reuse to the end of the life, is calculated (step S13-1).

Then, a price reference at the time the lease period expires is calculated (step S13-2).

Finally, a price of the battery is calculated based on the cumulate amount and the price reference (step S13-3).

As described with respect to FIG. 10, the battery price can be obtained from the product of the price reference and the cumulate amount. Even though the battery is used under the same setting conditions, the calculated value at the present time and the calculated value at the future time are considered to be different from each other. It may be necessary not to simply obtain a price of the battery by the product of the price reference and the cumulate amount, but to consider variations in price reference with elapsed time. An example of calculation in this case will be described below.

The battery price database 35a of the data collection firm information processing apparatus 20 is provided with a unique battery price table, to which only the respective lease firms 15 can refer, as a hidden file.

FIG. 22 is a view showing the contents of the battery price table in the battery price database 35a according to the embodiment.

The battery price of each assumed cumulate amount is set to the battery price table in addition to the set conditions and the price reference explained already. The assumed cumulate amount is an assumed value of the cumulate amount at the time the battery is used and the lease period expires. The assumed cumulate amount is a value corresponding to elapsed time. Since the cumulate amount is the assumed value, the cumulate amount includes all the representative values in a range which covers the cumulate amounts to be treated. The battery price is written for each of the combinations of the representative values of the cumulate amount and the set conditions.

The battery price written in the battery price table is the battery price when the battery is leased again (or sold again) after the lease period expires. The price varies at all times depending on under which set condition a repeat lease (or re-sale) is executed. To hedge a risk of a price variation when the battery is leased again or resold at the time the lease period expires, it is desired to set a lowest battery price of the battery prices corresponding to assumed set conditions so that many markets are available in which the battery can be leased or sold again at the time the lease period expires.

Note that although the case in which the battery price is determined by the table of the assumed cumulate amount is shown, the battery price may be directly obtained from the predicted cumulate amount determined in step S12 while the cumulate amount is set as a variable and the battery price is set as a function.

In step S14, a battery price is selected.

A person in charge of the lease firm 15 looks through a plurality of battery prices calculated under a plurality of setting conditions. He or she finds what setting condition enables a difference lease and what the battery price is. Then, he or she selects an appropriate battery price as a basis for calculation of a residual value by considering the number of settable conditions and the distribution of battery prices.

For example, when a lowest price in a group of the battery prices is selected and set as the battery price, regardless of set conditions employed in a repeat lease, the residual value is calculated from a battery price lower than the battery price under the set conditions at a high probability. Therefore, it is possible to suppress a loss of the lease firm 15.

As described above, an algorithm in step S14 can be programmed to automatically select a lowest battery price and the set conditions of the price. However, if an excessively low battery price is set, only a low residual value is set with the result that there is a possibility that a lease fee becomes expensive. The lease firm 15 can create various selection references by programming the algorithm so that a battery price exhibiting a lowest battery price can be obtained in the set conditions in which a large market is expected.

In step S15, a residual value necessary to calculate the lease fee is determined.

A method by which the residual value calculation unit 34d calculates the residual value will be explained. The residual value calculation unit 34d calculates the residual value by further multiplying the determined battery price by a coefficient $\alpha$ ($<1$) and records the residual value in the battery price database 35a. The relationship between the residual value and the battery price is shown by the following expression (1).

$$\text{Residual value} = \alpha \times (\text{battery price}) - \beta \qquad \text{Expression (1)}$$

Here, it is assumed that $\beta \geq 0$. More specifically, the battery price is a battery price according the predicted cumulate value determined technically, whereas the residual value is a battery price used to calculate the lease fee and determined from a business viewpoint. The price, which absorbs a business risk, is set by setting the residual value using the coefficient $\alpha$ ($<1$). Note that the residual value may be calculated using a function that uses the battery price as a parameter in place of the calculation using coefficients $\alpha$, $\beta$. Also in the case, a function, by which the relationship of residual value<battery price is established, is used.

In step S16, the lease firm information processing apparatus 25 instructs to calculate the lease fee. The lease fee calculation unit 34e of the data collection firm information processing apparatus 20 calculates the lease fee based on, for example, an expression 2.

$$\text{Lease fee} = (\text{initial battery price} - \text{residual value} + \text{interest} + \text{fixed asset tax} + \text{insurance premium} + \text{profit} + \text{risk rate})/\text{number of times of payment} \qquad \text{Expression (2)}$$

Figure 13:
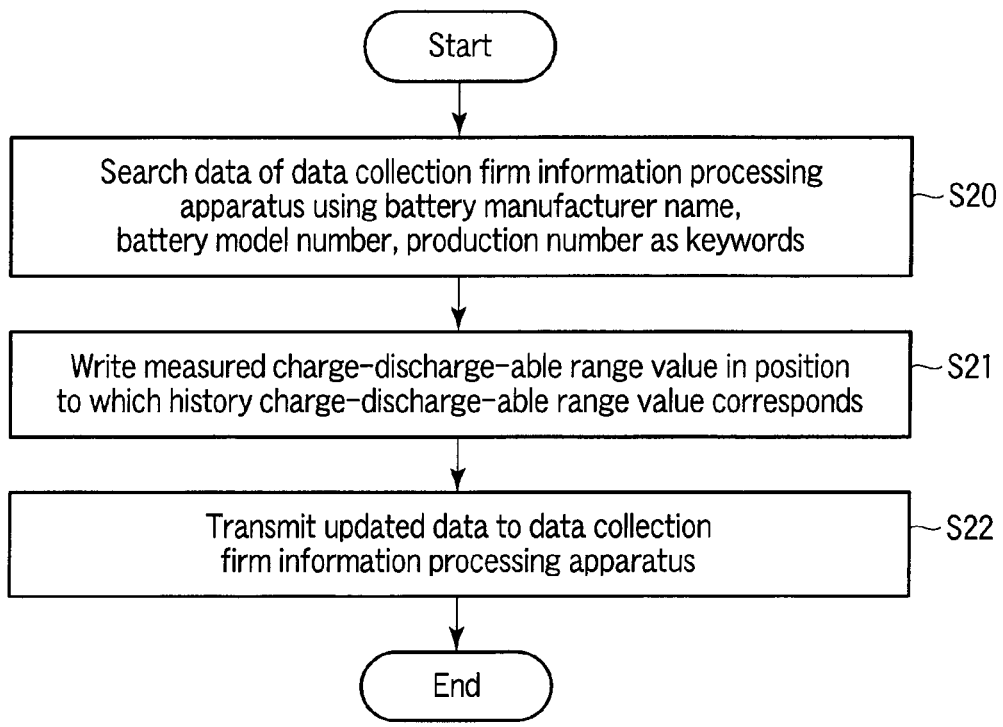
FIG. 13 is an exemplary view of a flowchart showing a schematic processing procedure of a history information transmission processing in an equipment maintenance firm information processing apparatus according to the embodiment.

FIG. 13 is an exemplary view of a flowchart showing a schematic processing procedure of a history information transmission processing in the equipment maintenance firm information processing apparatus according to the embodiment.

When the equipment maintenance firm 16 maintains the equipment in a periodic inspection, the equipment maintenance firm 16 measures the charge-discharge-able range value of the battery. The equipment maintenance firm 16 transmits the measured charge-discharge-able range value to the data collection firm information processing apparatus 20 as the battery history information.

FIG. 23 is an exemplary view of a table showing an example of a summing method used when it is intended to transmit the measured charge-discharge-able range value according to the embodiment.

In step S20, the information processing apparatus 26 searches the battery price database 35a of the data collection firm information processing apparatus 20 based on the keywords (battery manufacturer name, battery model number, and production number). Then, the equipment maintenance firm 16 measures the charge-discharge-able range value of the battery under all the obtained set conditions.

In step S21, the equipment maintenance firm 16 writes the measured charge-discharge-able range value in a position corresponding to the history charge-discharge-able range value of the battery price database 35a. In step S22, the equipment maintenance firm 16 transmits the updated data to the data collection firm information processing apparatus 20.

Figure 14:
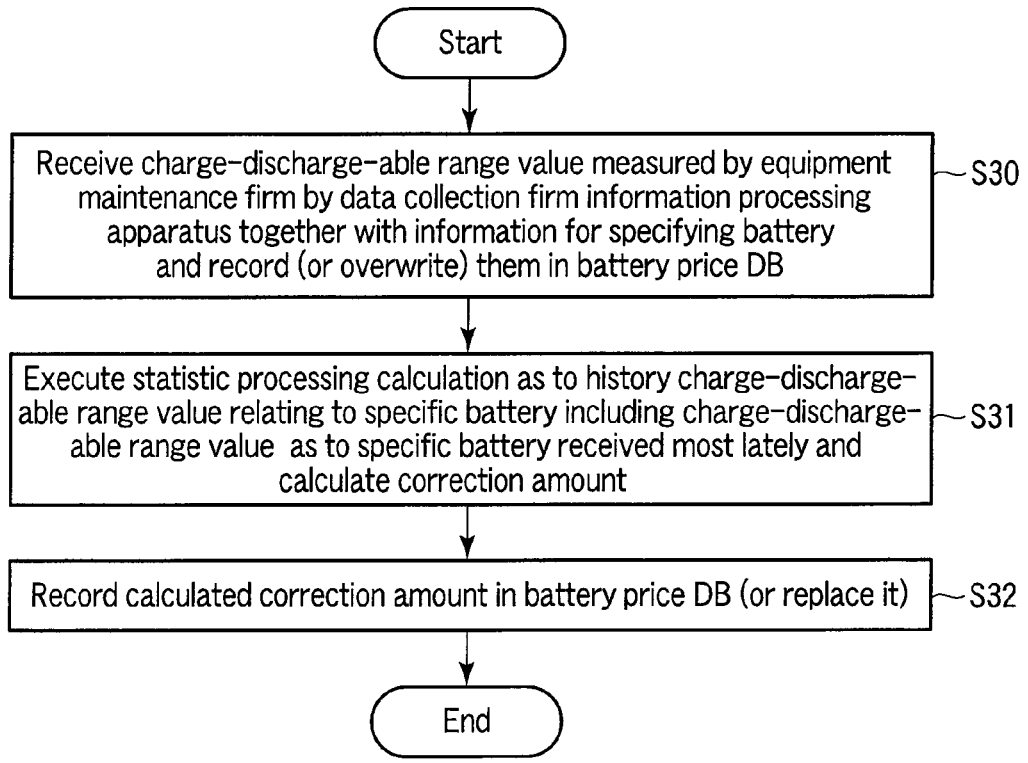
FIG. 14 is an exemplary view of a flowchart showing a schematic processing procedure of a history information processing in the data collection firm information processing apparatus according to the embodiment.

FIG. 14 is an exemplary view of a flowchart showing a schematic processing procedure of a history information processing in the data collection firm information processing apparatus according to the embodiment.

In step S30, the data collection firm information processing apparatus 20 receives the actually measured charge-discharge-able range value transmitted thereto from the equipment maintenance firm information processing apparatus 26 and records the charge-discharge-able range value in a relevant portion of the battery price database 35a as a part of the history charge-discharge-able range value at that time. When the history charge-discharge-able range value is accumulated, the unique state transition of the battery can be found.

Subsequently, the history information processing unit 34c preferably executes a statistical processing based on the history information.

In step S31, the history information processing unit 34c searches the battery price database 35a, collects the history charge-discharge-able range value data as to the data having the same battery manufacturer names and the same battery model numbers as well as the same set conditions and the same passed times, subjects the collected history charge-discharge-able range value to a statistical processing calculation, and determines statistical amounts such as an average, a dispersion, and a standard deviation. The statistical amounts are used to correct the standard data supplied from battery manufacturers as initial values.

In step S32, the history information processing unit 34c stores the calculated statistical amounts in the item "correction amount" of the files having the same battery manufacturer names and the same battery model numbers in each of the passed times.

When the characteristic data of the battery manufacturers are used after corrected, a latest correction amount can be commonly used for each battery of a specific type with respect to unassumed variation of characteristics.

Figure 15:
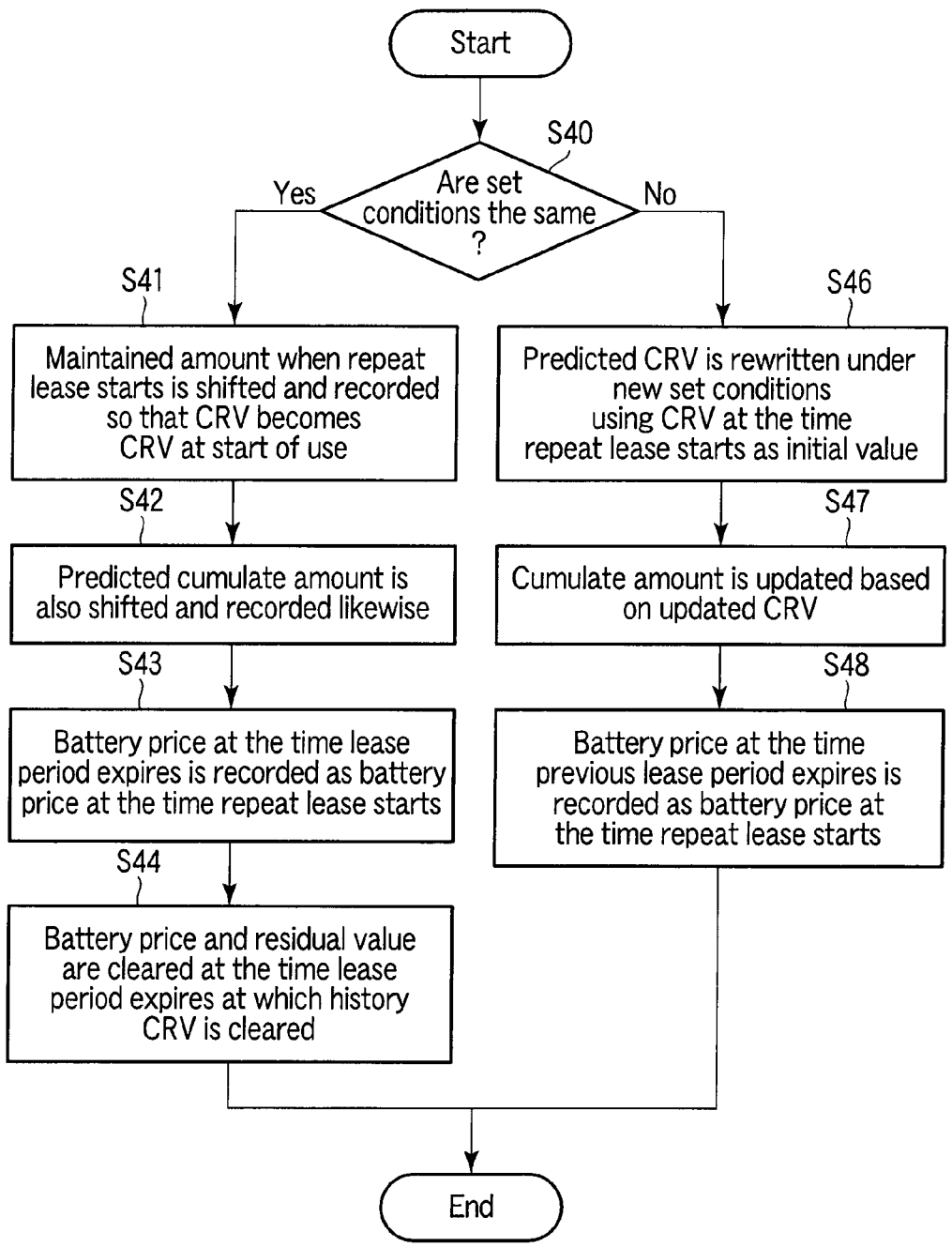
FIG. 15 is an exemplary view of a flowchart showing a schematic processing procedure of a repeat lease processing in the data collection firm information processing apparatus according to the embodiment.

FIG. 15 is an exemplary view of a flowchart showing a schematic processing procedure of a repeat lease processing in the data collection firm information processing apparatus according to the embodiment.

Even when the lease period of a new battery expires, the life of the battery still remains. Therefore, the battery can be resold or leased again as well as diverted to other use. In this case, the lease firm 15 instructs the data collection firm information processing apparatus 20 to lease the battery again by designating the battery manufacturer name, the battery model number, the production number, and the set conditions.

In the data collection firm information processing apparatus 20, which has received the instruction of the repeat lease, the repeat lease processing unit 34f is started and updates the data of the designated set conditions of the designated file to a repeat lease processable state.

In step S40, the repeat lease processing unit 34f examines whether or not the designated new set conditions are the same as the previous set conditions.

When the determination in step S40 is Yes, that is, when the new set conditions are the same as the previous set conditions, in step S41, the repeat lease processing unit 34f deletes the predicted charge-discharge-able range value from a lease start time to the present time and shifts and rewrites the data of the predicted charge-discharge-able range value so that the predicted charge-discharge-able range value at the present time becomes an initial predicted charge-discharge-able range value.

In step S42, the repeat lease processing unit 34f shifts the data of the predicted cumulate amount likewise.

In step S43, the repeat lease processing unit 34f records the battery price at the time the lease period expires to the battery price at the time the repeat lease starts.

In step S44, the repeat lease processing unit 34f clears the history charge-discharge-able range value and clears the battery price and the residual value at the time the lease period expires.

In contrast, when the determination in step S40 is No, that is, when the designated new set conditions are different from the previous set conditions, the repeat lease processing unit 34f updates the predicted charge-discharge-able range value using the charge-discharge-able range value at the time the lease starts as an initial value in step S46. Although the update is executed based on the data for transiting the charge-discharge-able range value owned by the battery manufacturer 11, the data of the predicted charge-discharge-able range value received by executing a communication with the battery manufacturer information processing apparatus 21 may be used for the update.

In step S47, the repeat lease processing unit 34f updates the predicted cumulate amount based on the updated predicted charge-discharge-able range value. Although the update is executed based on the data for transiting the cumulate amount owned by the battery manufacturer 11, the data of the predicted cumulate amount received by executing the communication with the battery manufacturer information processing apparatus 21 may be used for the update.

In step S48, the repeat lease processing unit 34f records the battery price at the time the previous lease period expires to the battery price at the time the repeat lease starts.

When the repeat lease processing unit 34f updates the data of the file, the repeat lease processing unit 34f can calculate also a repeat lease fee in the lease firm by the same procedure as the calculation of a new lease fee.

Figure 16:
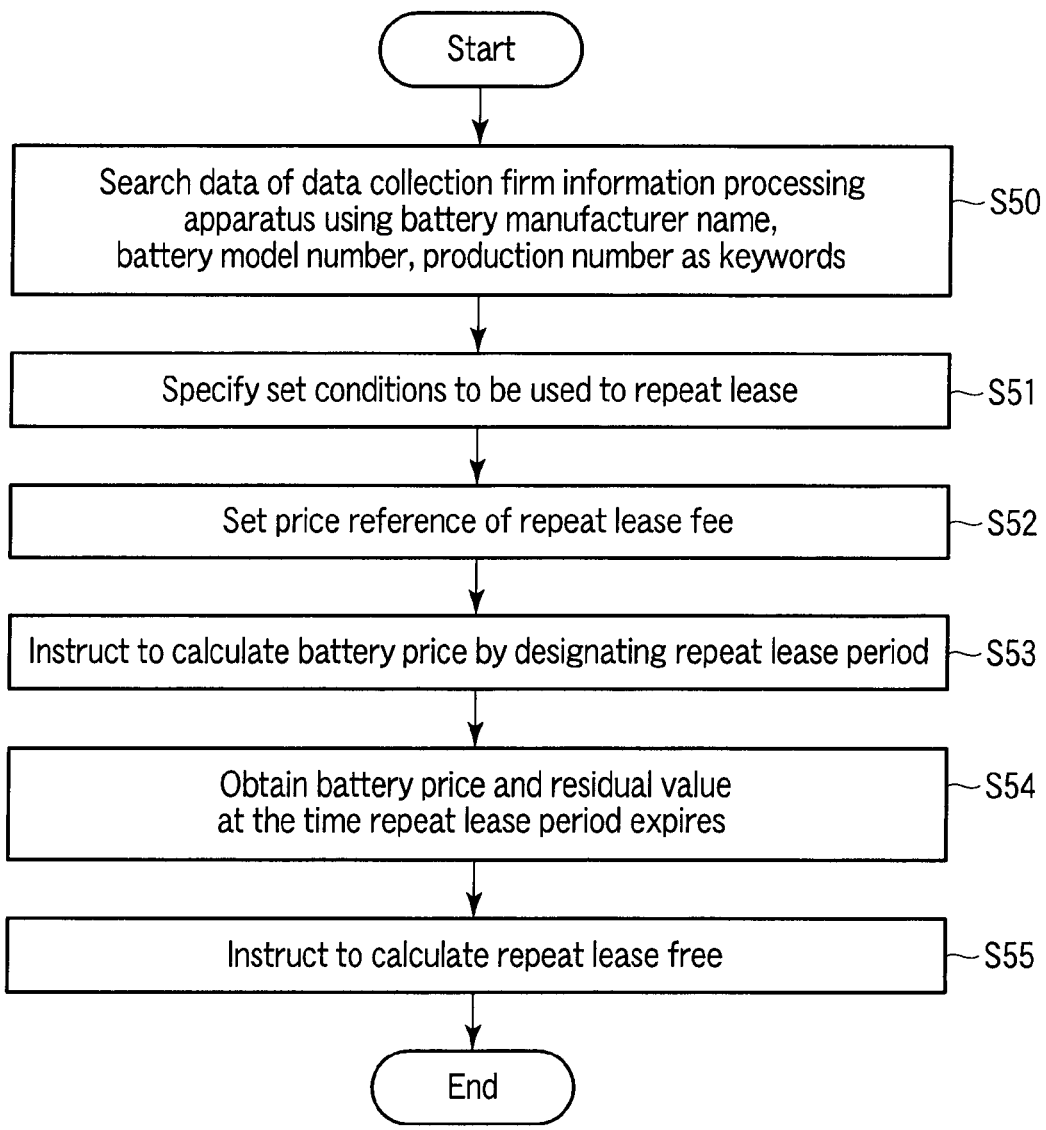
FIG. 16 is an exemplary view of a flowchart showing a schematic processing procedure when a repeat lease contract is concluded in the lease firm information processing apparatus according to the embodiment.

FIG. 16 is an exemplary view of a flowchart showing a schematic processing procedure when a repeat lease contract is concluded in the lease firm information processing apparatus according to the embodiment.

In step S50, the information processing apparatus 25 searches the battery price database 35a of the data collection firm information processing apparatus 20 based on the keywords (battery manufacturer name, battery model number, and production number of the battery). In step S51, the information processing apparatus 25 specifies the set conditions to be used by the repeat lease.

In step S52, the information processing apparatus 25 sets a price reference under the set conditions to be used. The price reference is a value calculated by the lease firm 15 based on the needs of a secondhand market uniquely investigated by the lease firm 15. However, the price reference is not limited to this mode and may be calculated by the price reference calculation unit 34b of the data collection firm information processing apparatus 20 referring to an achieved value under the same conditions set to the battery price database 35a and further may be calculated from different database disposed in the data collection firm information processing apparatus 20.

In step S53, when instructed to calculate the battery price by designating a repeat lease period, the residual value calculation unit 34d of the data collection firm information processing apparatus 20 extracts a predicted cumulate value for n (repeat lease period) years after the start of used of the battery price database 35a and calculates and records the battery price at the time the repeat lease period expires based on the predicted cumulate value and the price reference by the method explained in FIG. 12.

The residual value calculation unit 34d calculates a residual value by further multiplying the determined battery price by the coefficient α (<1) and records the residual value in the battery price database 35a. The relationship between the residual value and the battery price is shown by the expression (1).

Note that the residual value may be calculated using the function that uses the battery price as the parameter in place of the calculation using the coefficient α. The relationship of residual value<battery price is established also in the case.

It is suitable to determine the function so that the residual value becomes small when a dispersion (standard deviation) as the correction amount is large. For example, an expression (3) using a function g may be used.

$$\text{Residual value} = \text{battery price} \times g = \text{battery price} \times 0.7/(\text{standard deviation} + 1) \qquad \text{Expression (3)}$$

In the function g on the right side of the expression (3), since g (standard deviation)<1, the function is monotonously reduced by an increase in the standard deviation. As described above, the function g is generally defined as a function which is monotonously reduced by the increase in the standard deviation.

In step S54, the lease firm information processing apparatus 25 obtains the battery price and the residual value.

In step S55, the lease firm information processing apparatus 25 instructs to calculate the repeat lease fee. The lease fee calculation unit 34e of the data collection firm information processing apparatus 20 calculates the repeat lease fee based on, for example, the expression (4).

$$\text{Repeat lease fee} = (\text{battery price at the time repeat lease starts} - \text{residual value} + \text{interest} + \text{fixed asset tax} + \text{insurance premium} + \text{profit} + \text{risk rate})/\text{number of times of payment} \qquad \text{Expression (4)}$$

Next, a method of correcting the battery price based on the correction value determined from the history information will be explained.

FIG. 17 is an exemplary view of a graph showing the behaviors of the battery price and the set residual value. As described above, the lease firm 15 sets a price, which is lower than the battery price predicted at the time the lease period expires, as the residual value to obtain a merit. Since batteries X and batteries Y have the same price, they have the same residual value set thereto. However, the lives of batteries Y are unstably reduced by the degradation thereof and more dispersed than batteries X.

In this case, the residual value set to batteries X rarely becomes lower than the battery price thereof at the time the lease period expires, almost no loss is caused to the lease firm. In contrast, in batteries Y, the battery price becomes lower than the set residual value in many batteries. A loss is caused to the lease firm by such batteries.

Theoretically, the average price of batteries Y must become the same battery price as batteries X by the loss being compensated by batteries whose battery price is outstandingly expensive. However, in batteries Y, a case, in which the lives of the batteries whose battery price is outstandingly high are ended within the lease period, is also considered when it is taken into consideration that the degradation progressing state of the batteries is not stable. In this case, since there is a possibility that a complaint is issued to the batteries, batteries X cannot be considered to be the same as batteries Y in the aspect of money. Actually, when the residual value of batteries Y is set to the same residual value as batteries X, a profit is reduced. Therefore, it is preferable to set the residual value of batteries Y lower than that of batteries X.

Since the loss of batteries Y is caused by the dispersion of batteries Y being statistically larger than that of batteries X, it is only necessary to correct the residual value of batteries Y using the dispersion so that the residual value of batteries Y becomes lower than that of batteries X. To make explanation easy, the explanation has been made using the dispersion of the battery price. However, since the dispersion of the battery prices is caused by the degradation characteristics of the batteries and has a correlation with the dispersion of the charge-discharge-able range values of the batteries, it is necessary to correct the residual value using the dispersion of the charge-discharge-able range values of the batteries. The expression (3) described above shows a specific example of the correction.

Note that, although FIG. 16 explains the method of calculating the repeat lease fee when the repeat lease contract is concluded, the procedure of setting the residual value based on the history information can be applied likewise to also a processing for reviewing the lease fee during the lease period.

Next, a method of disclosing and practically using the information included in the battery price database 35a will be explained.

A broker firm (not shown), which acts as an intermediary between the plural lease firms 15 and the equipment user 14, discloses battery lease information as database referring to the battery price database 35a of the data collection firm information processing apparatus 20.

FIG. 18 is an exemplary view of a table showing the contents of the database disclosed by the broker firms according to the embodiment.

The database includes a battery price and lease fees of respective assumed lease periods together with set conditions, a battery model number, a production number, a predicted cumulate amount, and a lease firm name.

Note that the data as to all the set conditions included in the battery price database 35a of the data collection firm information processing apparatus 20 becomes a subject to be disclosed. Accordingly, the lease fees under the plural set conditions are disclosed as to the same battery model number.

Since the equipment user 14 can find which battery (model number/production number) can be leased at what lease fee by selecting an environment in which a battery is used by the set conditions, the equipment user 14 can easily specify a battery which is considered suitable and conclude a lease contract. Further, since the battery price is presented at the same time, it is possible for the equipment user 14 to consider buying a battery.

[Advantages of the Embodiment]

According to the battery value evaluation support apparatus of the embodiment explained above, a configuration for appropriately as well as efficiently evaluating the value of a secondhand rechargeable battery can be made, a residual value corresponding to a result of evaluation can be set, the operating lease can be employed, and establishment of a secondhand battery market can be accelerated. Not only the residual value of a battery which is reused in an electric vehicle but also the residual value of a battery which is reused for other purposes can be set depending on a way of providing an evaluation index.

Specifically, the following advantages can be exemplified.

(1) In the battery value evaluation support apparatus of the embodiment, the residual value of a battery can be appropriately as well as efficiently obtained. Accordingly, a lease system of the battery is promoted as well as a distribution of batteries in a secondhand market can be realized.

(2) Since the use condition (set condition) of the battery is made apparent, when the battery is reused, it can be applied to plural uses. The battery can be widely used in, for example, an unmanned transport vehicle, an electric moped, an electric motorcycle, a floor cleaner, digital multi-function printer (MFP), uninterruptible power supply (UPS) system, wind/solar power generation, and the like in addition to the application to the electric vehicle.

(3) It is possible to accelerate the practical use of the battery by a lease by making use of the database owned by the battery value evaluation support apparatus of the embodiment and disclosing a part of the database.

Note that the respective functions explained in the embodiment may be configured using hardware or may be realized by causing a computer to read a program in which the respective functions are written using software. Further, the respective functions may be configured by appropriately selecting any of software and hardware.

Further, the respective functions can be also realized by causing a computer to read a program stored in a recording medium (not shown). The recording medium in the embodiment may have any recording scheme as long as the recording medium can record a program and can be read by a computer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for making a battery value evaluation index, comprising:
applying a predetermined charge/discharge pattern to a predetermined battery, detecting a largest state of charge (SOC) value and a smallest SOC value of the predetermined battery, and setting a width between the largest SOC value and the smallest SOC value as "A";
detecting a charge limit SOC value which the battery exhibits when the battery is charged to a charge termination voltage by use of a charge current value at which the predetermined battery shows the highest SOC value, detecting a discharge limit SOC value which the battery exhibits when the battery is discharged to a charge termination voltage by use of a discharge current value at which the predetermined battery shows the lowest SOC value, and setting a width between the charge limit SOC value and the discharge limit SOC value as "B"; and
determining that a life of the predetermined battery has ended in the predetermined charge/discharge pattern when a state of B>A has changed into a state of B≦A.

2. The method according to claim 1, further comprising:
obtaining a temporal-change curved line representing how said "B" changes with time when the charge/discharge pattern is kept applied to the battery;
subjecting said "A" to time integration to obtain a cumulate value, until a point of time when the battery changes from B to A on the temporal-change curved line; and
calculating a residual value of the battery based on the cumulate value and outputting the calculated residual value.

3. The method according to claim 1, further comprising:
obtaining a temporal-change curved line representing how said "B" changes with time when the charge/discharge pattern is kept applied to the battery;
extrapolating a second temporal-change curved line to a predetermined point of time on the temporal-change curved line, the second temporal-change curved line representing how said "B" changes with time when a second charge/discharge pattern different from the charge/discharge pattern is applied to the battery;
subjecting said "A" to time integration to obtain a cumulate value, until a point of time when the battery changes to A on the temporal-change curved line; and
calculating a residual value of the battery based on the cumulate value and outputting the calculated residual value.

4. The method according to claim 2, further comprising:
extrapolating a temporal-change curved line corresponding to a case where the charge/discharge pattern is continued to a history of said "B" continuously measured with respect to the battery, such that the extrapolate temporal-change curved line is subsequent to a latest value of said "B", in order to obtain a temporal-change curved line representing how said "B" changes with time when the battery is kept used, with the charge/discharge pattern maintained.

5. The method according to claim 1, wherein the SOC value is converted and expressed in one of units including "%", "Ah" and "Wh."

6. An apparatus for making a battery value evaluation index, the apparatus comprising:
a recording unit and an operation unit,
the recording unit being configured to store a set of values of "B" which the battery is considered to exhibit when one of the predetermined charge/discharge patterns is applied to the battery, the set of values of "B" being prepared for each of the predetermined charge/discharge patterns, and "B" is a width between a charge limit state of charge (SOC) value and a discharge limit SOC value, and
the operation unit being configured to,
acquire a first set of values of "B" corresponding to a first charge/discharge pattern from the recording unit,
acquire a predicted value Ba at an arbitrary point of time from the first set of values of "B",
acquire a second charge/discharge pattern applied to the battery at the arbitrary point of time,
extrapolating a second set of values of "B" corresponding to a second charge/discharge pattern to the first set of values of "B", using the predicted value Ba as an initial value, in order to calculate a third set of values of "B",
acquire, from the third set of values of "B", a life point corresponding to a value of "A" corresponding to the second charge/discharge pattern, and "A" is a width between a largest SOC value and a smallest SOC value, and
subject said "A" to time integration to obtain a cumulate value, from the arbitrary point of time to the life point.

7. An apparatus for making a battery value evaluation index, comprising:
a recording unit configured to store: a required charge-discharge-able range value (RCRV) determined for each of use conditions of a battery; an integral value of the required charge-discharge-able range value (RCRV) obtained until a point of time when the battery becomes unusable under the use conditions; and a value reference determined for each of the use conditions; and a price calculation unit configured to calculate a battery price for each of the use conditions, based on the integral value and the value reference.

* * * * *